United States Patent
Chang et al.

(10) Patent No.: US 11,703,763 B2
(45) Date of Patent: Jul. 18, 2023

(54) METHOD OF LITHOGRAPHY PROCESS USING RETICLE CONTAINER WITH DISCHARGING DEVICE

(71) Applicant: Taiwan Semiconductor Manufacturing Company, Ltd., Hsinchu (TW)

(72) Inventors: Hsiao-Lun Chang, Tainan (TW); Chueh-Chi Kuo, Kaohsiung (TW); Tsung-Yen Lee, Jhudong Township, Hsinchu County (TW); Tzung-Chi Fu, Miaoli (TW); Li-Jui Chen, Hsinchu (TW); Po-Chung Cheng, Zhongpu Township, Chiayi County (TW); Che-Chang Hsu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/733,616

(22) Filed: Apr. 29, 2022

(65) Prior Publication Data
US 2022/0260901 A1    Aug. 18, 2022

Related U.S. Application Data

(62) Division of application No. 17/066,181, filed on Oct. 8, 2020, now Pat. No. 11,320,733, which is a division of application No. 15/884,801, filed on Jan. 31, 2018, now Pat. No. 10,802,394.

(60) Provisional application No. 62/589,240, filed on Nov. 21, 2017.

(51) Int. Cl.
| | | |
|---|---|---|
| *G03F 7/20* | (2006.01) | |
| *G03F 1/66* | (2012.01) | |
| *G03F 1/40* | (2012.01) | |
| G03F 1/24 | (2012.01) | |
| G03F 1/38 | (2012.01) | |

(52) U.S. Cl.
CPC .............. *G03F 7/2002* (2013.01); *G03F 1/40* (2013.01); *G03F 1/66* (2013.01); *G03F 1/24* (2013.01); *G03F 1/38* (2013.01)

(58) Field of Classification Search
CPC ..... G03F 1/24; G03F 1/38; G03F 1/40; G03F 1/66; G03F 7/2002
USPC ............................................................. 430/5
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 10,001,713 B2 | 6/2018 | Del Puerto et al. |
| 2002/0115001 A1 | 8/2002 | Hsue et al. |
| 2006/0154153 A1 | 7/2006 | Chiang et al. |
| 2015/0370180 A1 | 12/2015 | Del Puerto et al. |

FOREIGN PATENT DOCUMENTS

| | | |
|---|---|---|
| CN | 201091030 Y | 7/2008 |
| CN | 103748660 A | 4/2014 |
| CN | 105629657 A | 6/2016 |
| CN | 106486345 A | 3/2017 |
| JP | 2013-62485 A | 4/2013 |
| JP | 2013-70038 A | 4/2013 |
| TW | 201248312 A1 | 12/2012 |
| TW | 1598944 B | 9/2017 |
| WO | WO 01/75943 A2 | 10/2001 |

*Primary Examiner* — Christopher G Young
(74) *Attorney, Agent, or Firm* — Birch, Stewart, Kolasch & Birch, LLP

(57) ABSTRACT

A reticle, a reticle container and a method of lithography process are provided. The reticle container includes: a cover configured to protect a reticle, a baseplate, and a discharging device on the baseplate. The baseplate has: a top surface configured to engage to the cover and a bottom surface opposite to the top surface. The discharging device is configured to neutralize static charges accumulated on the reticle.

20 Claims, 20 Drawing Sheets

METHOD OF LITHOGRAPHY PROCESS USING RETICLE CONTAINER WITH DISCHARGING DEVICE

CROSS REFERENCE TO RELATED APPLICATIONS

This application is a divisional application of U.S. application Ser. No. 17/066,181, filed Oct. 8, 2020, which is a divisional application of U.S. application Ser. No. 15/884,801, filed Jan. 31, 2018 (now U.S. Pat. No. 10,802,394 issued on Oct. 13, 2020), which claims the benefit of U.S. Provisional Application No. 62/589,240, filed on Nov. 21, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

In one example associated with lithography patterning, a photomask (or mask) for use in a lithography process has a circuit pattern defined thereon that is to be transferred to wafers. In advanced lithography technologies, an extreme ultraviolet (EUV) lithography process is implemented with a reflective mask. It is important that the EUV mask be as clean and defect-free as possible.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
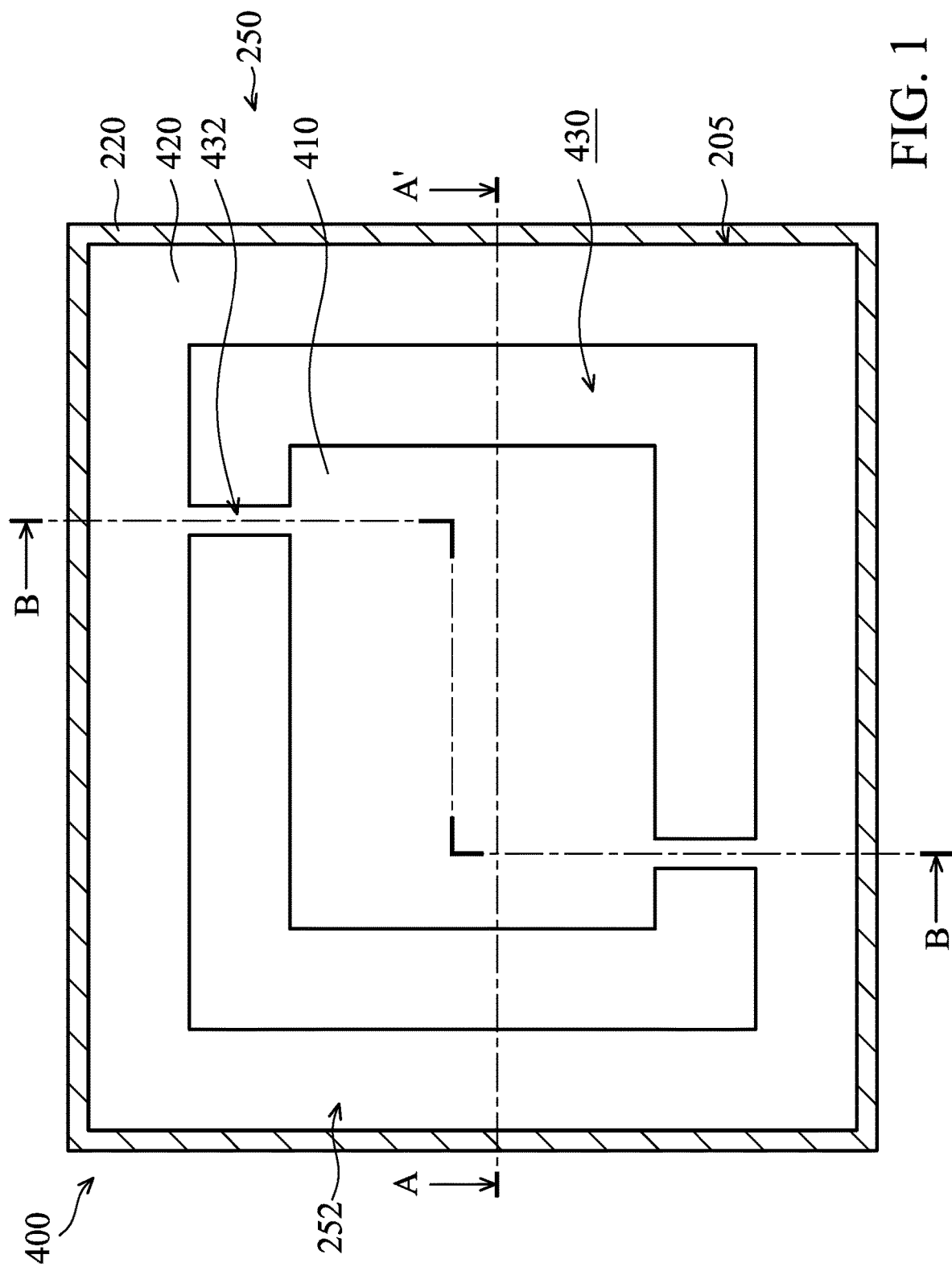
FIG. 1 is a top view of a reticle, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The advanced lithography process, method, and materials described in the current disclosure can be used in many applications, including fin-type field effect transistors (FinFETs). For example, the fins may be patterned to produce relatively close spacing between features, for which the above disclosure is well suited. In addition, spacers used in forming fins of FinFETs can be processed according to the above disclosure.

Figure 2A:
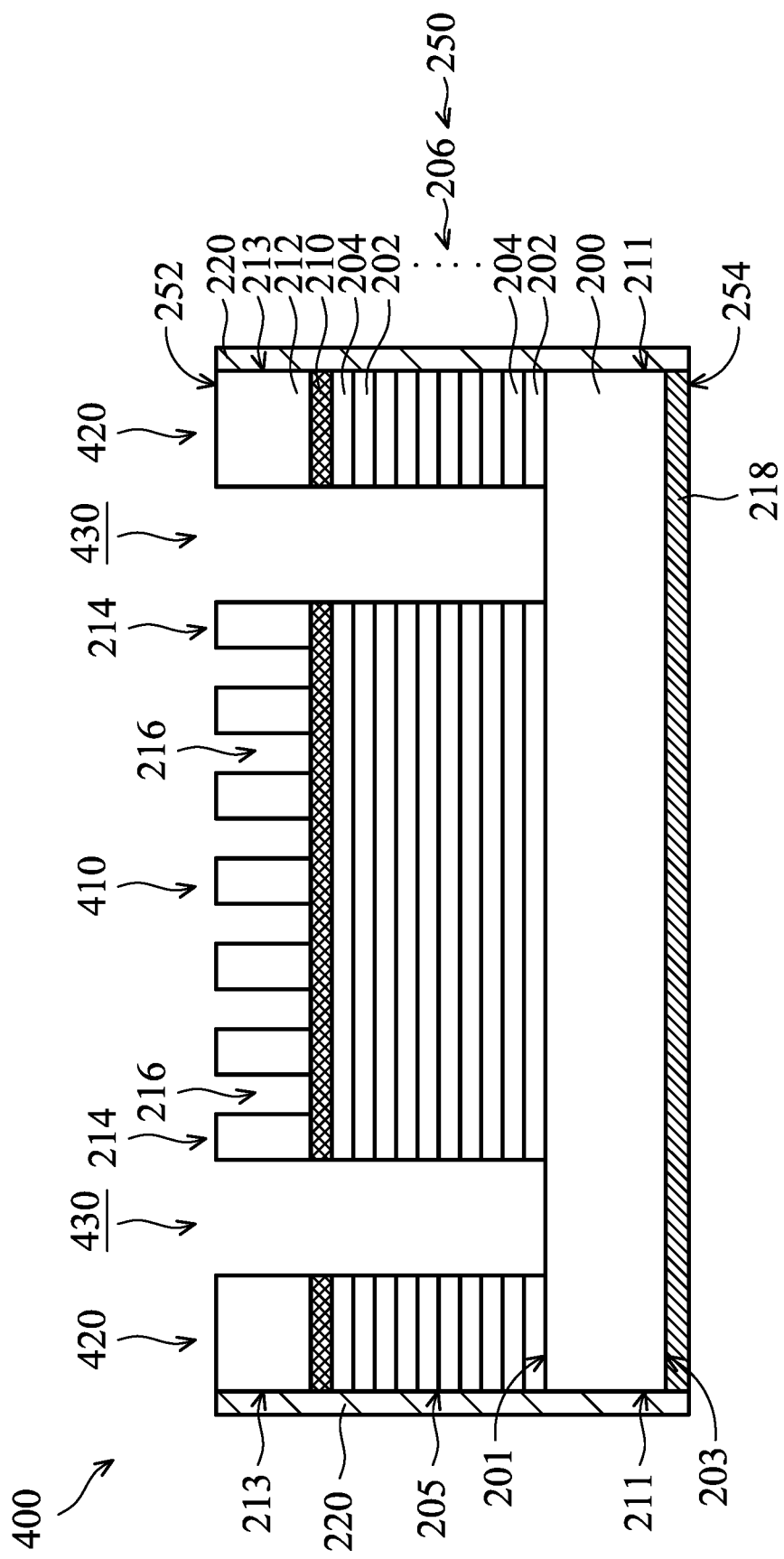
FIG. 2A is a cross-sectional view taken along line A-A' of FIG. 1, showing a cross-sectional view of a reticle, in accordance with some embodiments.
Figure 2B:
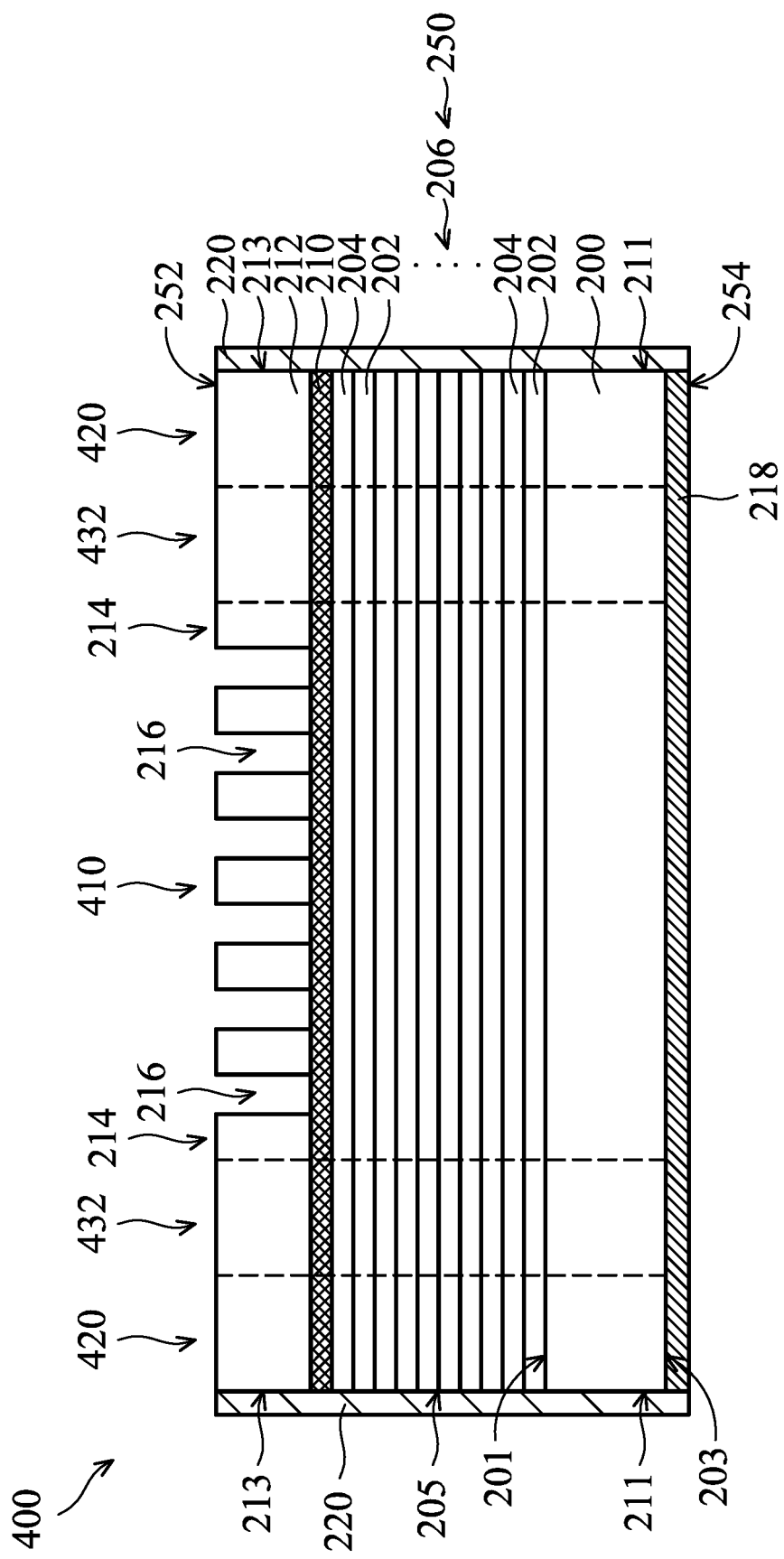
FIG. 2B is a cross-sectional view taken along line B-B' of FIG. 1, showing a cross-sectional view of a reticle, in accordance with some embodiments.

FIG. 1 is a top view of a reticle 400, in accordance with some embodiments. FIG. 2A is a cross-sectional view of the reticle 400 taken along line A-A' of FIG. 1. FIG. 2B is a cross-sectional view of the reticle 400 taken along line B-B' of FIG. 1. As shown in FIG. 1, FIG. 2A and FIG. 2B, the reticle 400 may have a front-side surface 252 and a back-side surface 254 opposite to the front-side surface 252. In some embodiments, the reticle 400 includes a stack 250 and a conductive material structure 220 covering a sidewall surface 205 of the stack 250. In should be noted that FIG. 1 is used to illustrate various portions arranged on the reticle 400 and reticle patterns (e.g., an absorption structure 212 shown in FIG. 2A and FIG. 2B) are not shown in FIG. 1 for clarity.

In some embodiments, the reticle 400 includes a pattern region 410, a border region 420 and a bridge region 432. In some embodiments, the pattern region 410 is located in the center portion of the reticle 400. In certain embodiments, the border region 420 may surround the pattern region 410. In such embodiments, the pattern region 410 may be separated from the border region 420 by a trench 430 as shown in FIG. 2A. The trench 430 may partially surround the pattern region 410, in some embodiments as shown in FIG. 1. The reticle 400 may include one or more bridge region 432 positioned between the pattern region 410 and the border region 420. The bridge region 432 of the reticle 400 may interconnect a portion of the pattern region 410 and a portion of the border region 420, as shown in FIG. 2B.

In some embodiments, the reticle 400 is an extreme ultraviolet (EUV) reticle. The EUV lithography process utilizes a reflective reticle rather than a transmissive reticle. The EUV lithography process utilizes EUV scanners that emit light in the extreme ultraviolet (EUV) region, which is light having an extreme ultraviolet wavelength, such as 10-15 nm. In some embodiments, the EUV source generates EUV with wavelength at about 13.6 nm. Some EUV scanners may use reflective optics, i.e. mirrors and work in the vacuum environment. EUV scanners may provide the desired pattern on an absorption layer (e.g., an "EUV" reticle absorber) formed on a reflective reticle. Within the EUV range, all materials are highly absorbing. Thus, reflective optics rather than refractive optics are used.

In some embodiments, the stack 250 of the reticle 400 includes a mask substrate 200, a reflective multilayer (ML) structure 206, a capping layer 210 and an absorption structure 212 as illustrated in FIG. 2A. In addition, the mask substrate 200, the reflective ML structure 206, the capping layer 210 and the absorption structure 212 may be positioned in the pattern region 410, the border region 420 and the bridge region 432 of the reticle 400 according to certain embodiments of the present disclosure.

As shown in FIGS. 2A and 2B, the mask substrate 200 of the stack 250 may have a front-side surface 201 and a back-side surface 203 opposite to the front-side surface 201. The mask substrate 200 may be made of a suitable material, such as a low thermal expansion material (LTEM) or fused quartz. In some embodiments, the LTEM includes $TiO_2$ doped $SiO_2$, or other suitable materials with low thermal expansion.

The reflective ML structure 206 of the stack 250 may be positioned over the front-side surface 201 of the mask substrate 200. In accordance with the Fresnel equations, light reflection occurs when light propagates across an interface between two materials of different refractive indices. The greater the difference between the refractive indices of layers, the higher the intensity of the reflected light becomes as it propagates across the layers. To increase the intensity of the reflected light, in some embodiments, a multilayer of alternating materials may be used to increase the number of interfaces so as to cause the light reflected from each of the different interfaces to interfere constructively. In some embodiments, the reflective ML structure 206 includes a plurality of film pairs, such as molybdenum-silicon (Mo/Si) film pairs (e.g. a layer of molybdenum above or below a layer of silicon in each film pair). In some other embodiments, the reflective ML structure 206 may include molybdenum-beryllium (Mo/Be) film pairs, or other suitable materials that are configurable to highly reflect the EUV light. The characteristics of the reflective ML structure 206 are selected such that it provides a high reflectivity to a selected electromagnetic radiation type/wavelength. For example, for the purpose of EUV lithography, the reflective ML structure 206 may be designed to reflect light within the EUV range. The thickness of each layer of the reflective ML structure 206 depends on the EUV wavelength and the incident angle. Particularly, the thickness of the reflective ML structure 206 (and the thicknesses of the film pairs) may be adjusted to achieve a maximum constructive interference of the EUV light diffracted at each interface and a minimum absorption of the EUV light. In some embodiments, the number of the film pairs in the reflective ML structure 206 may be in a range from about 20 to about 80. However, any number of film pairs may be used. For example, the reflective ML structure 206 may include forty pairs of layers of Mo/Si. For example, each Mo/Si film pair has a thickness of about 7 nm and the reflective ML structure 206 has a total thickness of 280 nm.

In some embodiments, the capping layer 210 of the stack 250 is positioned over the reflective ML structure 206. The capping layer 210 is designed to be transparent to EUV light and to protect the reflective ML structure 206 from damage and/or oxidation. In addition, the capping layer 210 may serve as an etching stop layer in a patterning or repairing/cleaning process of the absorption structure 212 over the capping layer 210. The capping layer 210 may have different etching characteristics from the absorption layer. In some embodiments, the capping layer 210 is formed of ruthenium (Ru), Ru compounds such as RuB and RuSi, chromium (Cr), Cr oxide, and Cr nitride. A low temperature deposition process may be often chosen for forming the capping layer 210 so as to prevent inter-diffusion of the reflective ML structure 206. The thickness of the capping layer 210 may be in a range from about 2 nm to about 7 nm in certain embodiments.

The absorption structure 212 of the stack 250 may be positioned over the capping layer 210. The absorption structure 212 is used to form the desired exposure pattern (e.g., the absorption structure 212 in the pattern region 410) onto the front-side surface 252 of the reticle 400. In some embodiments, the absorption structure 212 is an absorption material to absorb radiation in the EUV wavelength range projected onto the pattern region 410 of the reticle 400. For example, the reticle 400 can be referred to as a Binary Intensity Reticle (BIM). In some embodiments, the absorption layer 210 may be patterned according to an IC layout pattern (or simply IC pattern). For example, the absorption layer 210 may be patterned to form opaque regions 214 and reflective regions 216. In the opaque region 214, the absorption layer 210 may remain on the stack 250. An incident light is almost fully absorbed by the absorber. In the reflective regions 216, the absorption layer 210 may be removed and the incident light is reflected by the underlying reflective ML structure 206. In some embodiments, the absorption structure 212 in the pattern region 410 and the absorption structure 212 in the border region 420 are electrically connected to the capping layer 210.

In some examples, the absorption structure 212 may include multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, and/or mixture of some of the above.

In some embodiments, the reticle 400 further includes a conductive layer 218 positioned on the back-side surface 203 of the mask substrate 200 for the electrostatic chucking purpose. In some embodiments, the conductive layer 218 includes tantalum boron (TaB), chromium nitride (CrN), though other suitable compositions are possible in other embodiments according to the present disclosure.

In some embodiments, the conductive material structure 220 is positioned over a sidewall surface 211 of the mask substrate 200 and a sidewall surface 213 of the absorption structure 212. The conductive material structure 220 may surround the conductive layer 218. The conductive material structure 220 of the reticle 400 may be in contact with the absorption structure 212 and the conductive layer 218. In addition, the conductive material structure 220 of the reticle 400 may be in contact with the reflective ML structure 206 and the capping layer 210. Furthermore, the conductive material structure 220 may be in contact with the absorption structure 212 in the border region rather than the absorption structure 212 in the pattern region 410. In some embodiments, the conductive material structure 220 is formed of metals including copper, aluminum, aluminum-copper, cobalt, tungsten, silver, palladium, ruthenium, molybdenum, other suitable materials, and/or mixture of some of the above. In some embodiments, the conductive material structure 220 may have different etching characteristics from the absorption structure 212. For example, the conductive material structure 220 may be formed of ruthenium (Ru), Ru compounds such as RuB, RuSi, chromium (Cr), Cr oxide, and Cr nitride. In some embodiments, the conductive material structure 220 may be formed by a physical vapor deposition (PVD) process (e.g. an electro-plating process), an atomic layer deposition (ALD) process, or another applicable process. In addition, the conductive material structure 220 may be formed by a low temperature deposition process.

Figure 3A:
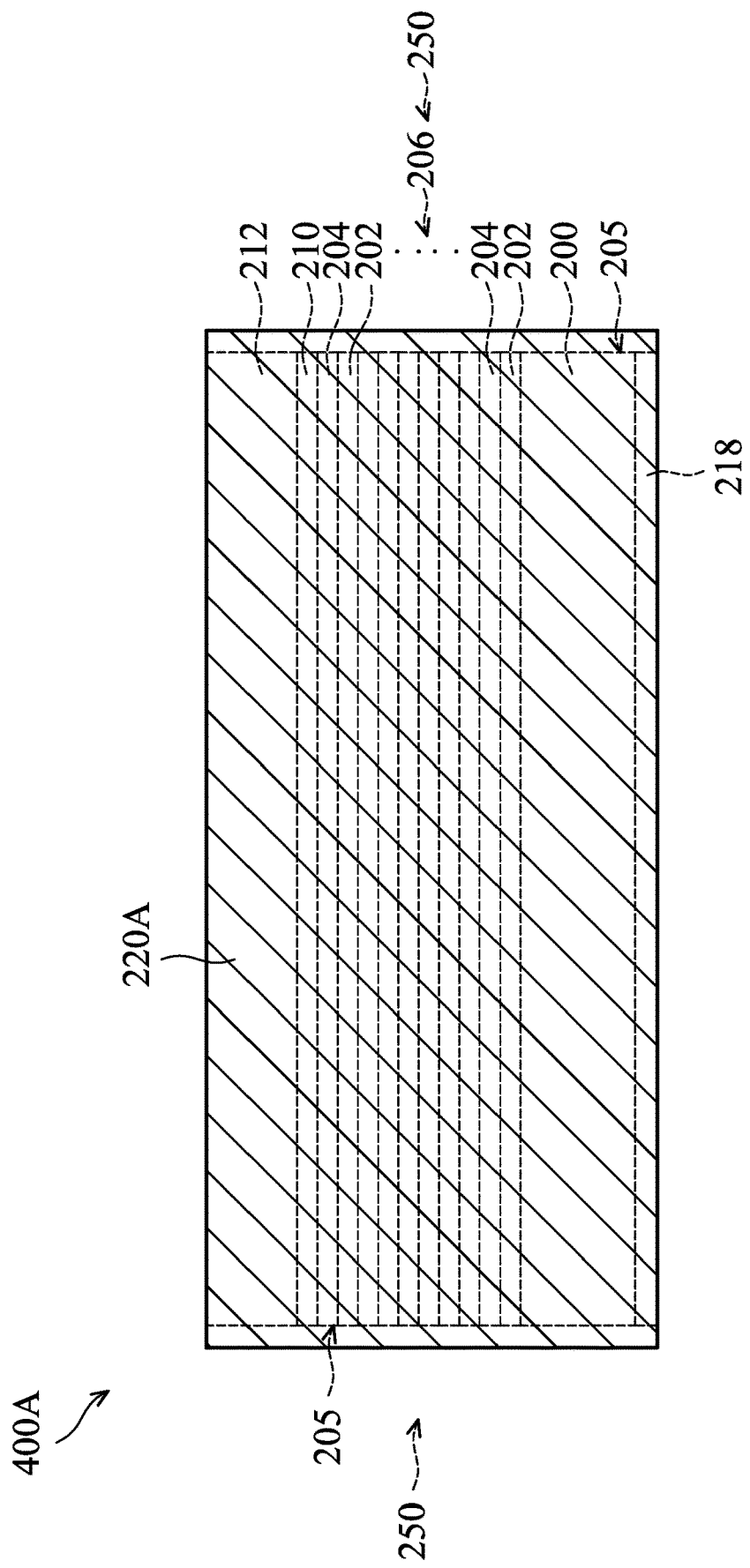
FIGS. 3A-3D are side-views of a reticle, showing various arrangements of a conductive material structure on a sidewall surface of the reticle, in accordance with some embodiments.
Figure 3B:
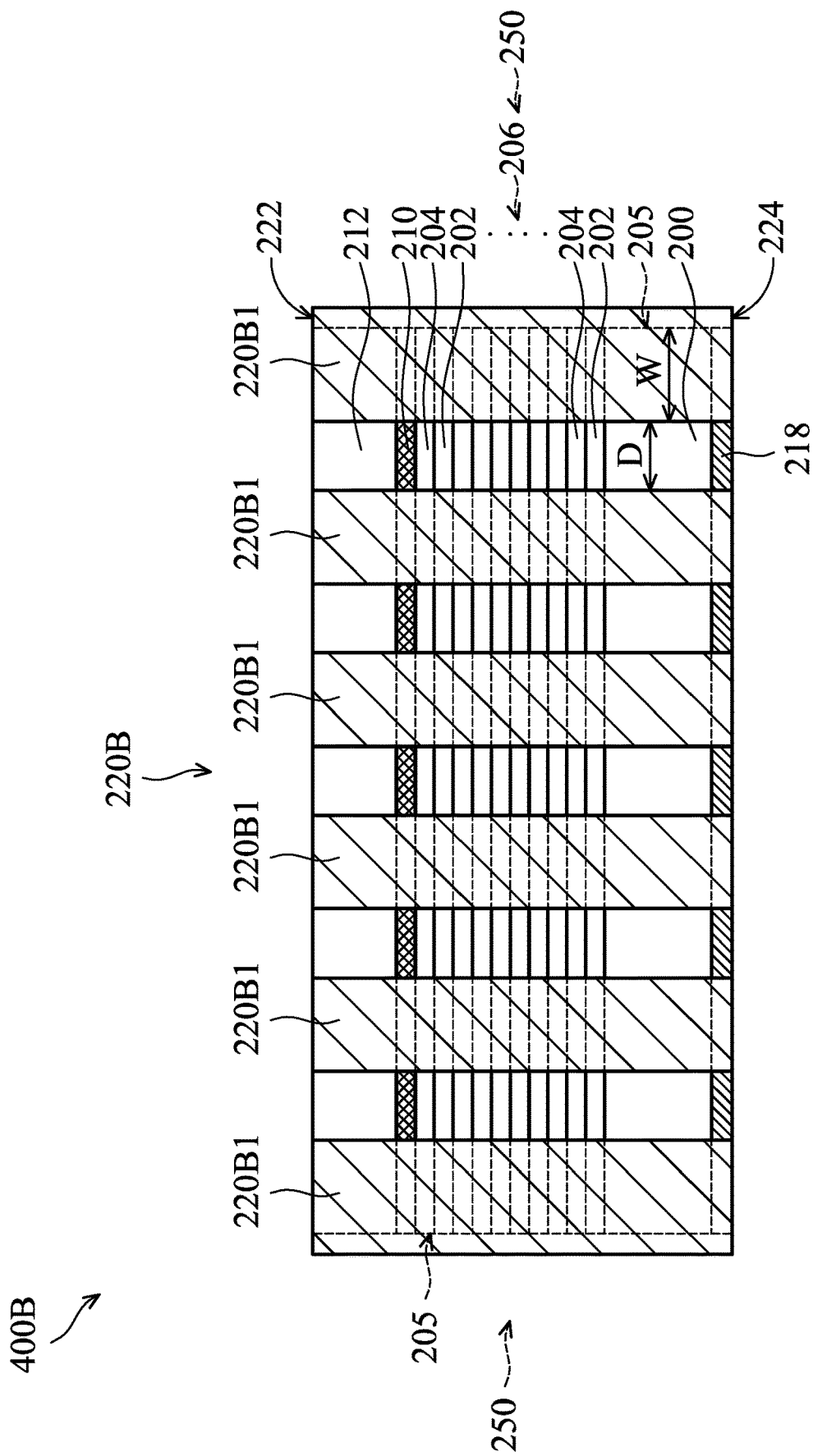
Figure 3C:
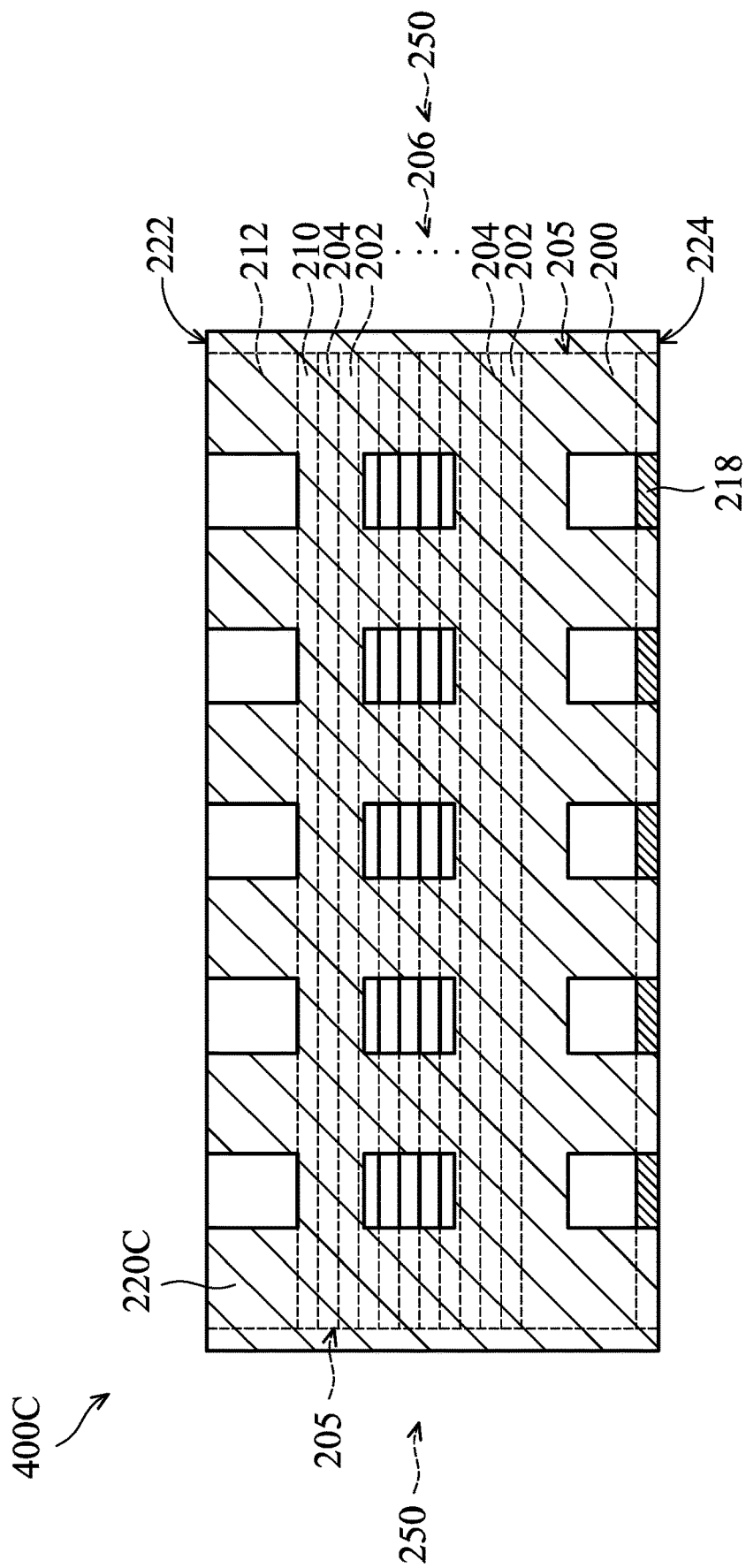
Figure 3D:
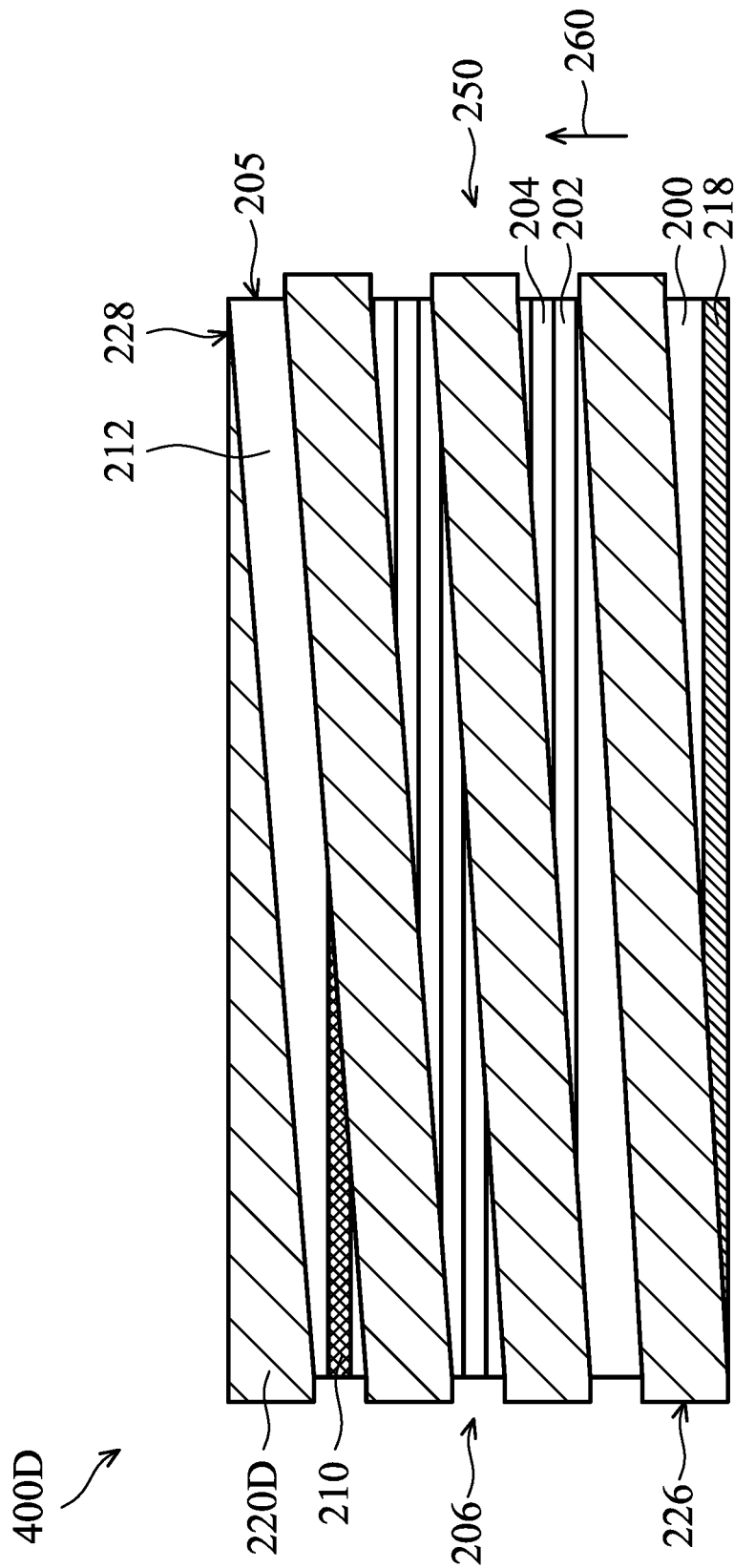

FIGS. 3A-3D are side-views of the reticle 400A, 400B, 400C and 400D according to certain embodiments of the present disclosure. In addition, FIGS. 3A-3D illustrate various arrangements of conductive material structures 220A, 220B, 220C and 220D in accordance with certain embodiments. For example, as shown in FIG. 3A, the conductive material structure 220A may be formed on the entire sidewall surface 205 of the stack 250 of the reticle 400A. For example, as shown in FIG. 3B, the conductive material structure 220B may be formed covering a portion of the sidewall surface 205 of the stack 250 of the reticle 400B. The conductive material structure 220B may include a plurality of conductive strips 220B1 according to certain embodiments of the present disclosure. Each of the conductive strips 220B1 of the conductive material structure 220B may have a width W. The conductive strips 220B1 of the conductive material structure 220B may be separated from each other by a distance D. In some embodiments, two terminals 222 and 224 of each of the conductive strips 220B1 of the conductive material structure 220B are respectively in contact with the absorption structure 212 and the conductive layer 218 of the stack 250 of the reticle 400B. For example, as shown in FIG. 3C, the conductive material structure 220C is formed covering a portion of the sidewall surface 205 of the stack 250 of the reticle 400C. The conductive material structure 220C may be grid-shaped. The conductive material structure 220C may be constructed by spaced bars that are parallel to or cross each other. In some embodiments, terminals of some spaced bars are respectively in contact with the absorption structure 212 and the conductive layer 218 of the reticle 400C. For example, as shown in FIG. 3D, the conductive material structure 220D may be spiral-shaped and may cover a portion of the sidewall surface 205 of the stack 250 of the reticle 400D. The conductive material structure 220D may be formed about an axis 260 perpendicular to the front-side surface 201 of the mask substrate 200. In some embodiments, two terminals 226 and 228 of each of the conductive material structure 220D are respectively in contact with the absorption structure 212 and the conductive layer 218 of the reticle 400D.

In some common used reticles, opaque regions of an absorption structure (e.g. reticle patterns) in a pattern region may have a relatively small area and have no enough conductive paths between a front-side surface and a back-side surface of the reticle. As such, when the lithography exposure process is performed in a lithography system, the back-side surface of the reticle is clamped on a reticle electrostatic-clamp by an electrostatic force generated by the reticle electrostatic-clamp. In addition, induced static charges caused by the electrostatic force may accumulate on a front-side surface of the reticle. The induced static charges form a relative high static electric field on the opaque regions of an absorption structure and cause the electrostatic discharge damage.

In some embodiments, the reticle (e.g., the reticle 400, 400A, 400B, 400C and 400D) includes the conductive material structure (e.g., the conductive material structures 220, 220A, 220B, 220C and 220D) covering the sidewall surface 205 of the stack 250. The conductive material structure may be in contact with the absorption structure 212 and the conductive layer 218. In addition, the absorption structure 212 may be positioned close to the front-side surface 252 and the conductive layer 218 may be positioned close to a back-side surface 254 of the reticle 400. Such arrangement of the conductive material structure may conduct the static charges accumulated on the front-side surface 252 of the reticle 400 to the reticle electrostatic-clamp when the conductive material structure of the reticle is in contact with the reticle electrostatic-clamp. Therefore, the conductive material structure may protect the opaque regions 214 of the absorption structure 212 (e.g. the reticle patterns) from the electrostatic discharge damage.

When the reticle is shipped or transferred in an ambient environment, molecules of the air may rub the reticle. Static charges may be induced and accumulated on surfaces of the absorption structure and the mask substrate. Because each of the reticle patterns has a relatively small area, the induced static charges on the absorption structure and the mask substrate form a relative high static electric potential thereon. The particulate contamination (such as particles, powders, and organic matters) that adheres to the reticle due to the electric potential may result in degradation of the quality of the projected pattern. Therefore, the reticle may be shipped or transferred by positioned within a reticle container in order to maintain the cleanliness of the reticle.

Figure 4:
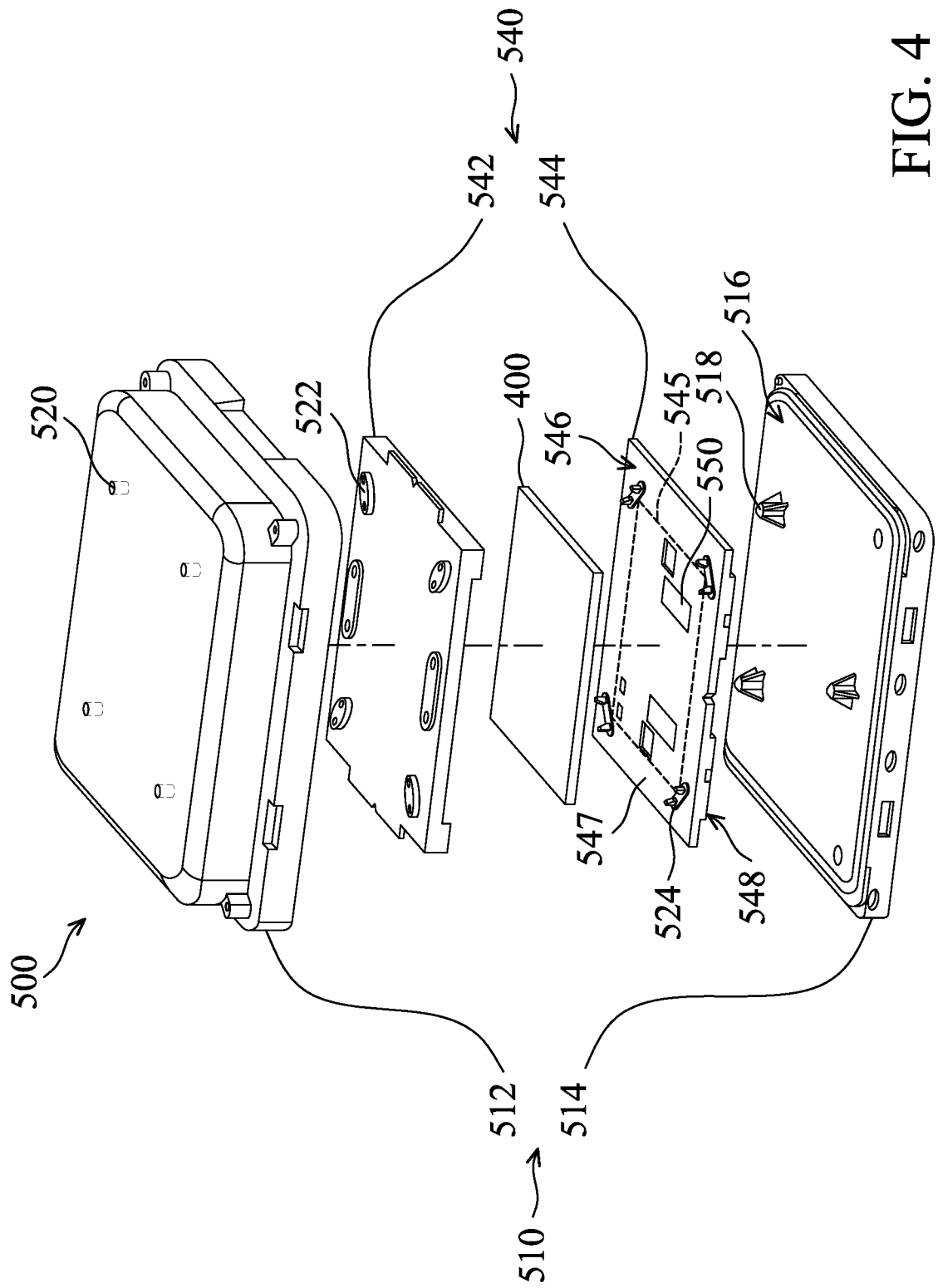
FIG. 4 is an explosive view of a reticle container, in accordance with some embodiments.

FIG. 4 is an explosive view of the reticle container 500, in accordance with some embodiments. The reticle container 500, which may be a dual reticle pod, is configured to accommodate the reticle 400. In some embodiments, the reticle container 500 includes an outer pod 510 and an inner pod 540. The outer pod 510 may include a top cover portion 512 and a bottom cover portion 514. The bottom cover portion 514 may engage to the top cover portion 512 to define a space surrounded by a top surface 516 of the bottom cover portion 514 and an inner surface of the top cover portion 512. The bottom cover portion 514 may include supporters 518 on the top surface 516, and the top cover portion 512 may include supporters 520 protruding toward the bottom cover portion 514. Therefore, the space formed by engaging the top cover portion 512 and the bottom cover portion 514 may accommodate and fasten the inner pod 540.

In some embodiments, the inner pod 540 is configured so that the outer pod 510 can fit around the inner pod 540. For example, the inner pod 540 may be properly placed in the space defined by the outer pod 510. In addition, the inner pod 540 may have proper size and shape corresponding to the outer pod 510. In some embodiments, the inner pod 540 includes a cover 542 and a baseplate 544. The cover 542 may be configured to protect the reticle 400. In addition, the cover 542 may include fasteners 522 positioned close to four corners in a periphery region of the cover 542. The fasteners 522 may help the cover 542 fastening to the baseplate 544. The baseplate 544 may have a top surface 546 and a bottom surface 548 opposite to the top surface 546. In addition, the baseplate 544 may include supporters 524 positioned on the top surface 546. The supporters 524 are positioned close to four corners in a periphery region of the baseplate 544. Therefore, four corners of the reticle 400 may be supported by the supporters 524. The baseplate 544 may be configured to engage to the cover 542 to form a space surrounded by the top surface 546 of the baseplate 544 and an inner surface of the cover 542. In addition, the space formed by adjoining the cover 542 and the baseplate 544 together may accommodate the reticle 400. When the inner pod 540 is fastened in the outer pod 510, the baseplate 544 of the inner pod 540 may be in contact with the supporters 518 of the bottom cover portion 514 of the outer pod 510. The reticle 400 is located in the inner pod 540, and the inner pod 540 is located in the outer pod 510 of the reticle container 500. As a result, further protection for the reticle 400 is provided.

Figure 5A:
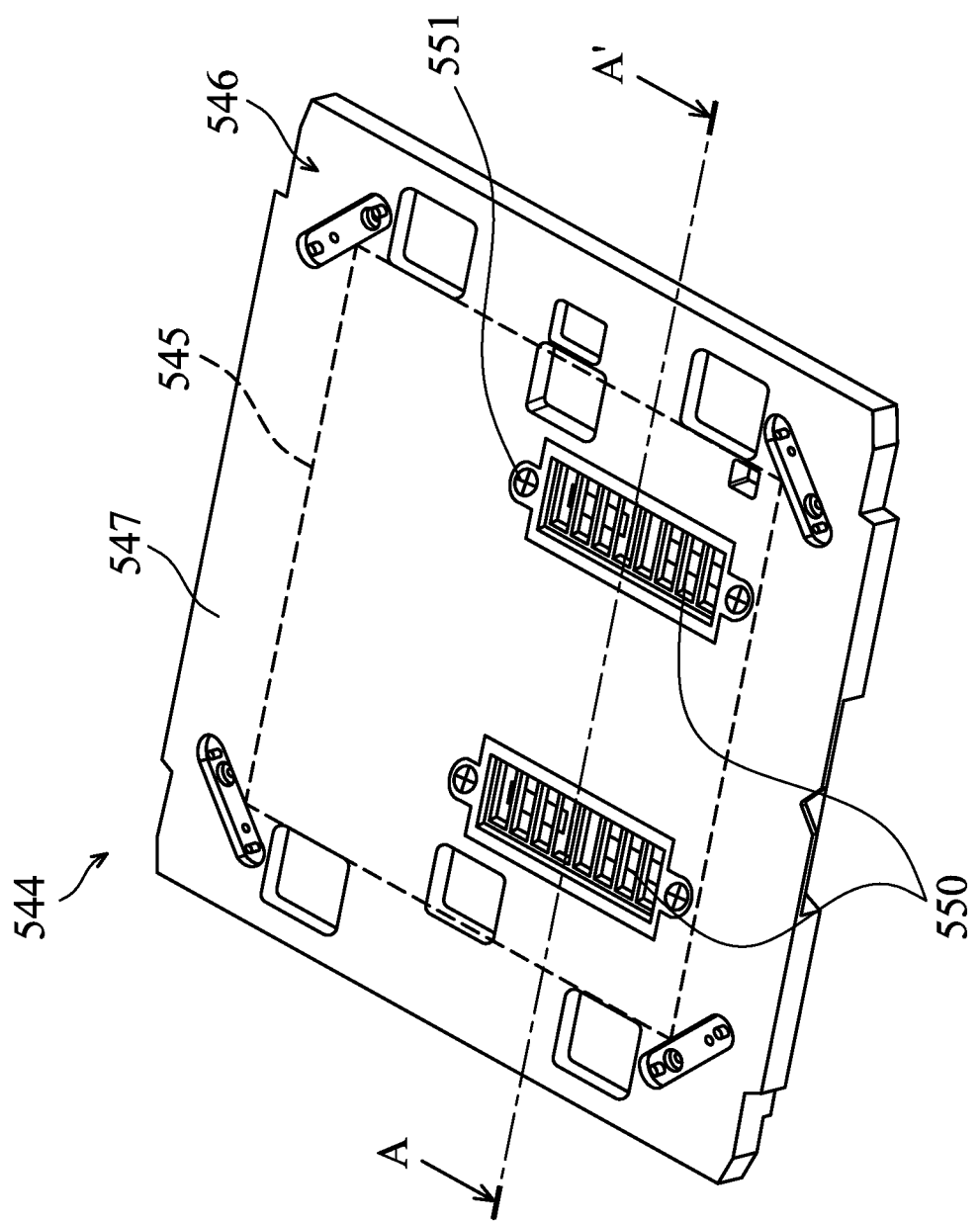
FIG. 5A is a top view of a baseplate of an inner pod of a reticle container, in accordance with some embodiments.
Figure 5B:
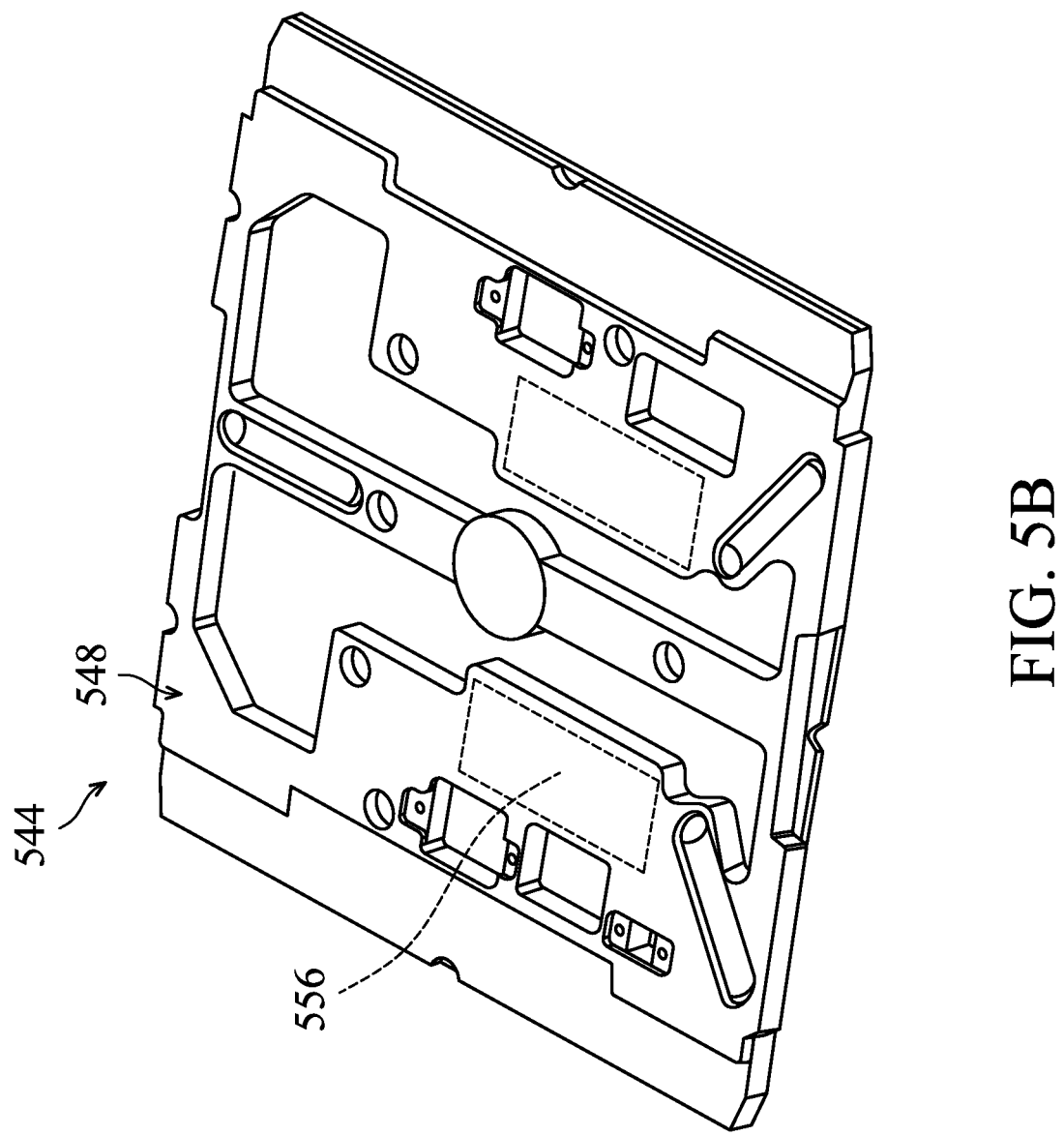
FIG. 5B is a bottom view of a baseplate of an inner pod of a reticle container, in accordance with some embodiments.
Figure 5C:
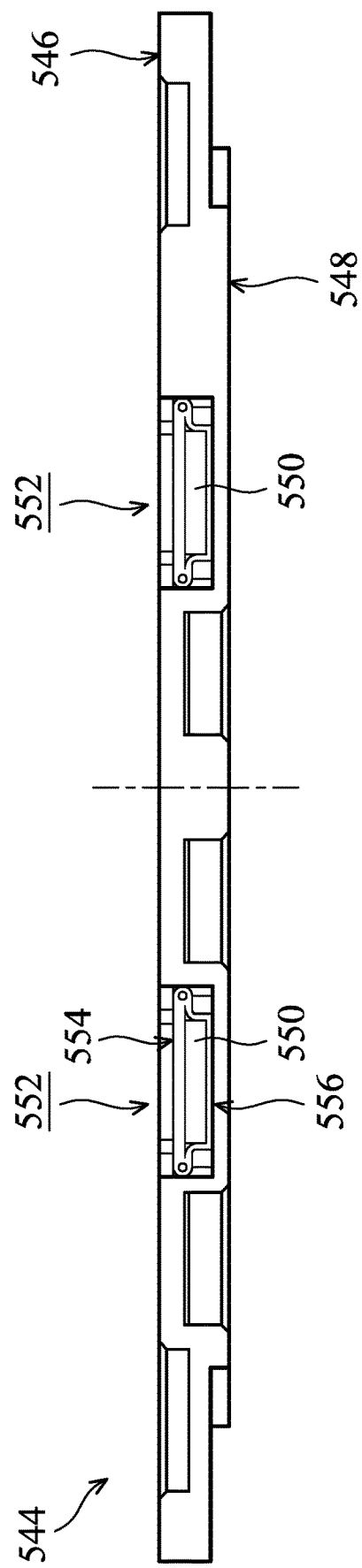
FIG. 5C is a cross-sectional view taken along line A-A' of FIG. 5A, showing a baseplate of an inner pod of a reticle container, in accordance with some embodiments.

FIGS. 5A, 5B and 5C are respectively a top view, a bottom view and a cross-sectional view of the baseplate 544 of the inner pod 540 of the reticle container 500. In some embodiments, the top surface 546 of the baseplate 544 has a reticle region 545 and a peripheral region 547 surrounding the reticle region 545. The reticle region 545 may be provided to support the reticle 400 (FIG. 4). The inner pod 540 of the reticle container 500 further includes one or more discharging device 550 positioned in the reticle region 545 of the baseplate 544. In some embodiments, the discharging device 550 is configured to neutralize static charges accumulated on the reticle 400 when the reticle 400 supported by the baseplate 544 is shipped or transferred in an ambient environment or in a vacuum environment.

In some embodiments, the discharging device 550 is positioned in a recessed groove 552 of the baseplate 544 as illustrated in FIG. 5C. In addition, the discharging device 550 may be fastened by a fixed device (e.g. a screw) 551. The recessed groove 552 may be formed by recessing the top surface 546 of the baseplate 544 in the reticle region 545. A top surface 554 of the discharging device 550 may be positioned between the top surface 546 and the bottom surface 548 of the baseplate 544. In addition, a bottom surface 556 of the recessed groove 552 may be positioned between the top surface 546 and the bottom surface 548 of the baseplate 544. Therefore, the discharging device 550 is exposed to the top surface 546 of the baseplate 544. When the reticle 400 supported by the baseplate 544, the top surface 554 of the discharging device 550 may face the top surface 252 of the reticle 400. Furthermore, the bottom surface 548 of the baseplate 544 may cover the discharging device 550.

Figure 6:
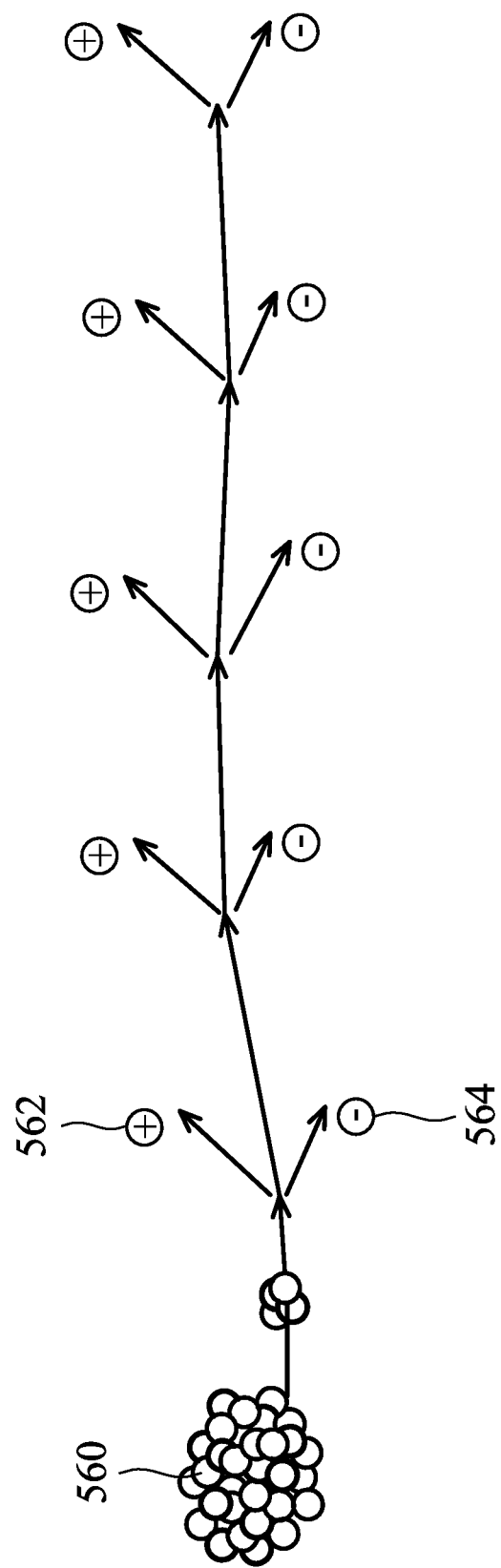
FIG. 6 is schematic view of alpha particles emitted form a discharging device.

The discharging device 550 may include an alpha-ionizer (not shown). The alpha-ionizer may be configured to emit alpha particles 560 to collide with and ionize hydrogen ($H_2$) in the air to produce positively charged particles 562 or negatively charged particles 564 as shown in FIG. 6. The positively charged particles 562 or negatively charged particles 564 may attract their counterparts in order to neutralize the static charges on the reticle 400.

In some embodiments, the reticle container 500 includes the discharging device 550 fixed on the baseplate 544 of the inner pod 540. For example, the discharging device 550 may continuously produce positively charged particles or negatively charged particles. For example, the discharging device 550 may intermittently produce positively charged particles or negatively charged particles by a controller (not shown). When the reticle 400 positioned in the inner pod 540 (or on the baseplate 544) is shipped or transferred in the ambient environment or in the vacuum environment, where the induced static charges accumulated on the reticle 400 may be neutralized by the discharging device 550. Therefore, the reticle container 500 may prevent the reticle 400 from the particulate contamination (such as particles, powders, and organic matters).

Figure 7:
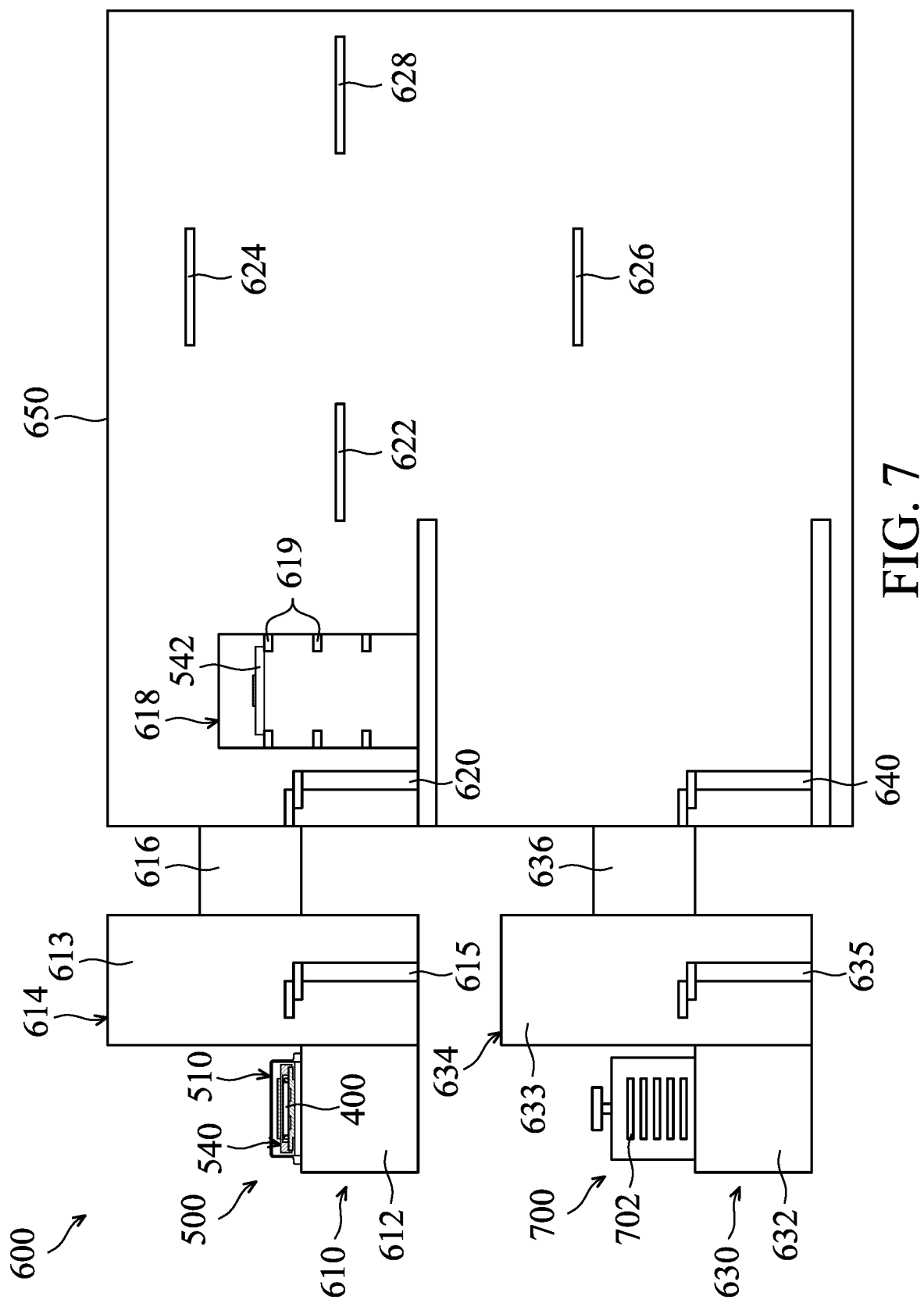
FIG. 7 is a schematic view of a lithography system, in accordance with some embodiments.

FIG. 7 is a schematic view of a lithography system 600, in accordance with some embodiments. In some embodiments, the lithography system 600 includes a lithography exposure apparatus. The lithography exposure apparatus may be extreme ultraviolet (EUV) scanners or the like. In some embodiments, the lithography system 600 includes a reticle load/unload station 610, a wafer load/unload station 630 and an exposure chamber 650. The reticle load/unload station 610 may be configured to load, unload and transfer the reticle 400 within the reticle container 500 in accordance with certain embodiments. The wafer load/unload station 630 may be configured to load, unload and transfer wafers 702 in a wafer container 700 in accordance with certain embodiments. In addition, the exposure chamber 650 may be configured to perform the lithography exposure process. The exposure chamber 650 is connected to the reticle load/unload station 610 and the wafer load/unload station 630. It should be appreciated that the features described below can be replaced or eliminated in other embodiments of the lithography exposure system 600.

In some embodiments, the reticle load/unload station 610 includes a reticle load port 612, a reticle interface module 614 and a reticle load lock chamber 616. The reticle load port 612 may be configured to load the reticle container 500, which stores the reticle 400. The reticle interface module 614 may be configured to handle the inner pod 540 from the outer pod 510. The reticle interface module 614 includes a housing 613, and one or more transferring means such as a robotic arm 615, in accordance with some embodiments. In some embodiments, the reticle interface module 614 includes an equipment front end module (EFEM). In certain embodiments, the robotic arm 615 is disposed within the housing 613 and is configured for physically transporting the inner pod 540. For example, the robotic arm 615 may retrieve the inner pod 540 from the outer pod 510 to the housing 613, or the robotic arm 615 may transport the inner pod 540 to and from the load lock chamber 616. However, the locations where the robotic arm 615 may transport the inner pod 540 are not limited by the present embodiment.

The reticle load lock chamber 616 is located between the reticle interface module 614 and the exposure chamber 650. The reticle load lock chamber 616 is configured for preserving the atmosphere within the exposure chamber 650 by separating it from the reticle interface module 614. The reticle load lock chamber 616 is capable of creating an atmosphere compatible with the exposure chamber 650 or the reticle interface module 614, depending on where the loaded inner pod 540 is scheduled to be next. This can be performed by altering the gas content of the reticle load lock chamber 616 by such means as adding gas or creating a vacuum, along with other suitable means for adjusting the atmosphere in the reticle load lock chamber 616.

In some embodiments, the wafer load/unload station 630 includes a wafer load port 632, a wafer interface module 634 and a wafer load lock chamber 636. The wafer load port 632 may be configured to load the wafer container 700 for storing the wafers 702. The wafer interface module 634 may be configured to handle the wafer from the wafer container 700. The wafer interface module 634 includes a housing 633, and one or more transferring means such as a robotic arm 635, in accordance with some embodiments. In some embodiments, the wafer interface module 634 includes an equipment front end module (EFEM). The robotic arm 635 is disposed within the housing 633. The robotic arm 635 is configured for physically transporting the wafer 702. For example, the robotic arm 635 may retrieve the wafer 702 from the wafer container 700 to the housing 633, or the robotic arm 635 may transport the wafer 702 to and from the wafer load lock chamber 636. However, the locations where the robotic arm 635 may transport the wafer 702 are not limited by the present embodiment.

The wafer load lock chamber 636 is located between the wafer interface module 634 and the exposure chamber 650. The wafer load lock chamber 636 is configured for preserving the atmosphere within the exposure chamber 650 by separating it from the wafer interface module 634. The wafer load lock chamber 636 is capable of creating an atmosphere compatible with the exposure chamber 650 or the wafer interface module 634, depending on where the wafer is scheduled to be next. This can be performed by altering the gas content of the wafer load lock chamber 636 by such means as adding gas or creating a vacuum, along with other suitable means for adjusting the atmosphere in the wafer load lock chamber 636.

In some embodiments, the exposure chamber 650 includes a cover handling module 618, a transfer mechanism 620, a reticle exchanging station 622, a reticle electrostatic-clamp (E-clamp) 624, a wafer electrostatic-clamp (E-clamp) 626 and a radiation source 628. The exposure chamber 650 preserves a vacuum environment at an ultra-high vacuum pressure in a range from about $10^{-6}$ Pa to about $10^{-10}$ Pa.

The cover handling module 618, the transfer mechanism 620, the reticle exchanging station 622, the reticle E-clamp 624, the wafer electrostatic-clamp 626 and the radiation source 628 are positioned in the exposure chamber 650. The cover handling module 618 is configured for storing one or more covers 542 removed from the inner pod 540. In some embodiments, the cover handling module 618 includes a number of holding members 619 for supporting the covers 542 removed from the inner pod 540. The reticle E-clamp 624 is configured for securing the reticle 400 during the lithography exposure process. The wafer E-clamp 626 is configured for securing the wafer during the lithography exposure process. In some embodiments, the reticle E-clamp 624 and the wafer E-clamp 626 create a clamping force by generating an electrostatic field.

The reticle exchanging station 622 is configured to support the baseplate 544 of the inner pod 540 before the reticle 400 is secured by the reticle E-clamp 624 or after the baseplate 544 is released from the reticle E-clamp 624. In some embodiments, the reticle exchanging station 622 is positioned relative to the reticle E-clamp 624. In some other embodiments, the reticle exchanging station 622 is able to be moved by a driving member, such as linear motor (not shown). To place the reticle 400 on a preset position of the reticle E-clamp 624, an alignment tool (such as a camera, not shown in figures) produces information about the position of the reticle exchanging station 622 and/or the reticle E-clamp 624, and the reticle exchanging station 622 is moved by using the information from the alignment tool to perform an alignment process on the reticle exchanging station 622 relative to the reticle E-clamp 624.

The transfer mechanism 620 is configured to transfer the inner pod 540 or the baseplate 544 of the inner pod 540 within the exposure chamber 650. The transfer mechanism 620 may be elevated, moved leftward and rightward, moved forward and backward, and rotated around the vertical axis so as to transfer the inner pod 540 or the baseplate 544 of the inner pod 540 among the reticle load lock chamber 616, the cover handling module 618, and the reticle exchanging station 622.

Figure 8:
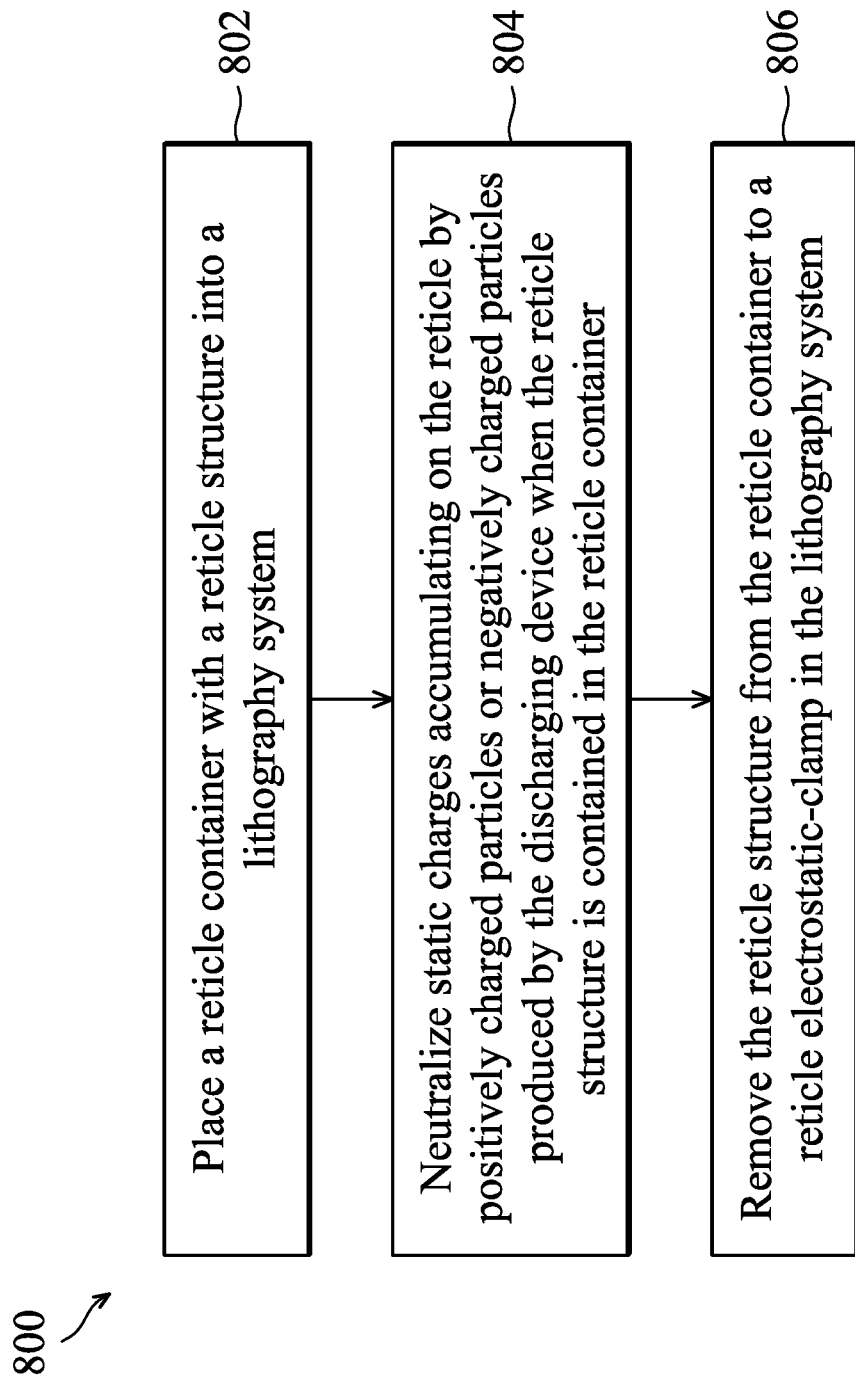
FIG. 8 is a flowchart of a method for discharging static charges accumulated on a reticle, in accordance with some embodiments.
Figure 9:
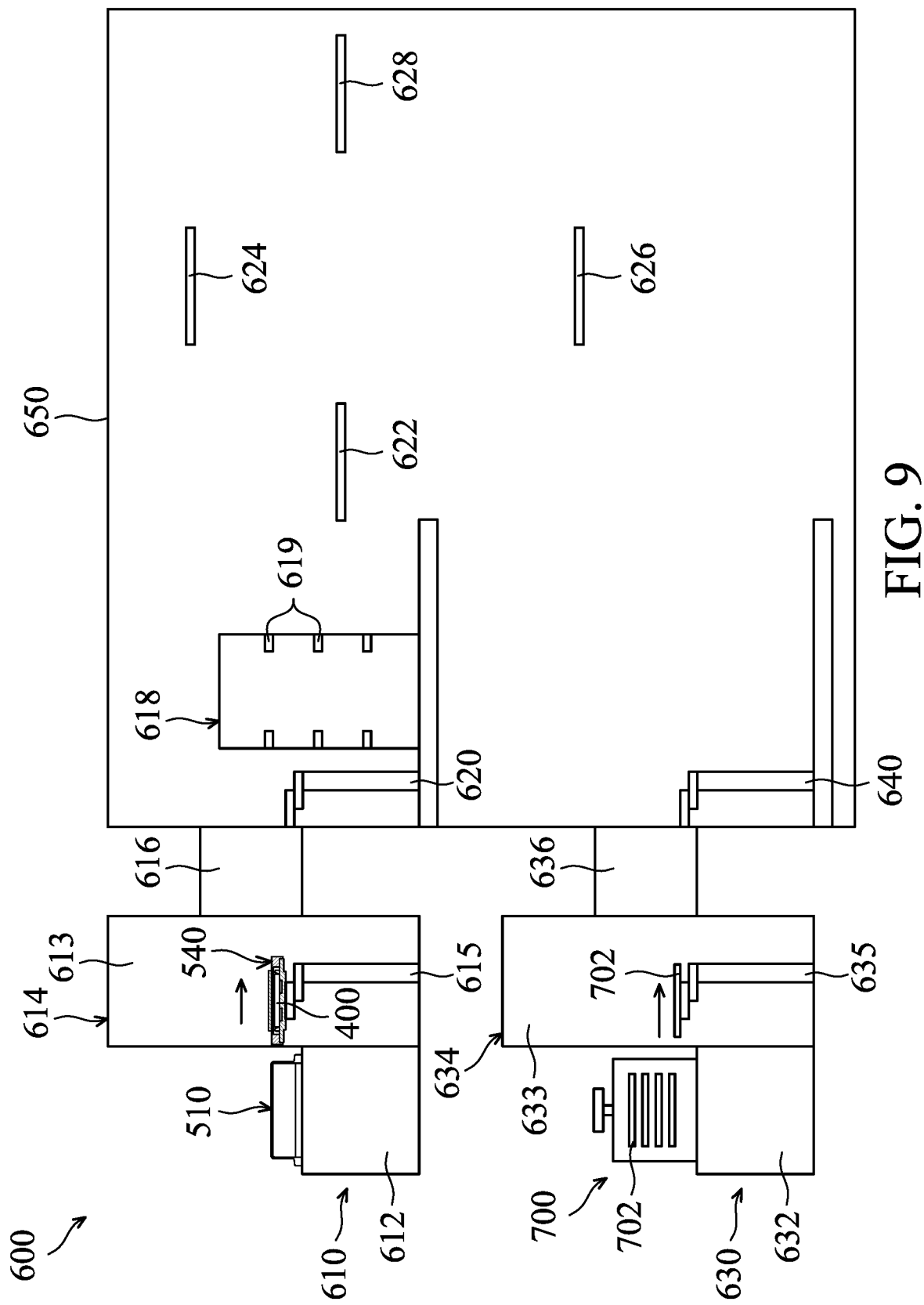
FIG. 9 shows a schematic view of a stage of a method for discharging static charges accumulated on a reticle, in accordance with some embodiments.

FIG. 8 is a simplified flowchart of a method 800 for discharging static charges accumulated on the reticle 400, in accordance with some embodiments. For illustration, the flowchart will be described along with the drawings shown in FIG. 7 and FIGS. 9-13. Some of the described stages can be replaced or eliminated in different embodiments.

The method 800 may include an operation 802, in which the reticle container 500 with the reticle 400 is placed into the lithography system 600. In some embodiments, the reticle 400 includes the stack 250 and the conductive material structure 220 connecting the absorption structure 212 and the conductive layer 218 of the reticle 400 (FIGS. 1, 2A and 2B). In some embodiments, the reticle container 500 includes the outer pod 510 and the inner pod 540. In addition, the discharging device 550 is positioned on the baseplate 540 and in the inner pod 540 (FIGS. 4 and 5A-5C).

In some embodiments, to perform a lithography exposure process using the reticle 400, the reticle container 500 which contains the reticle 400 in the inner pod 540 is placed on the reticle load port 612 of the lithography system 600, as shown in FIG. 7. After the reticle container 500 is placed on the reticle load port 612, the inner pod 540 is removed from the outer pod 510 by the robotic arm 615 and moved toward the reticle load lock chamber 616, in the direction indicated by the arrow in FIG. 9.

In some embodiments, the method 800 may further include placing a wafer container 700 with wafers 702 into the lithography system 600. The wafer container 700 which contains the wafers 702 is placed on the wafer load port 632 of the lithography system 600, as shown in FIG. 7. After the wafer container 700 is placed on the wafer load port 632, the wafer 702 is removed from the wafer container 700 by the robotic arm 635 and moved toward the wafer load lock chamber 636, in the direction indicated by the arrow in FIG. 9.

The method 800 also includes an operation 804, in which the static charges accumulated on the reticle 400 are neutralized by positively charged particles 562 or negatively charged particles 564 (FIG. 6) produced by the discharging device 550 when the reticle 400 is contained in the reticle container 500. For example, when the reticle 400 is transferred from the reticle load port 612 and moved toward the reticle load lock chamber 616 in an ambient environment, the induced static charges that have accumulated on the reticle 400 may be neutralized by positively charged particles 562 or negatively charged particles 564 (FIG. 6) produced by the discharging device 550 in the inner pod 540, shown in FIGS. 7 and 9 and 10.

Figure 10:
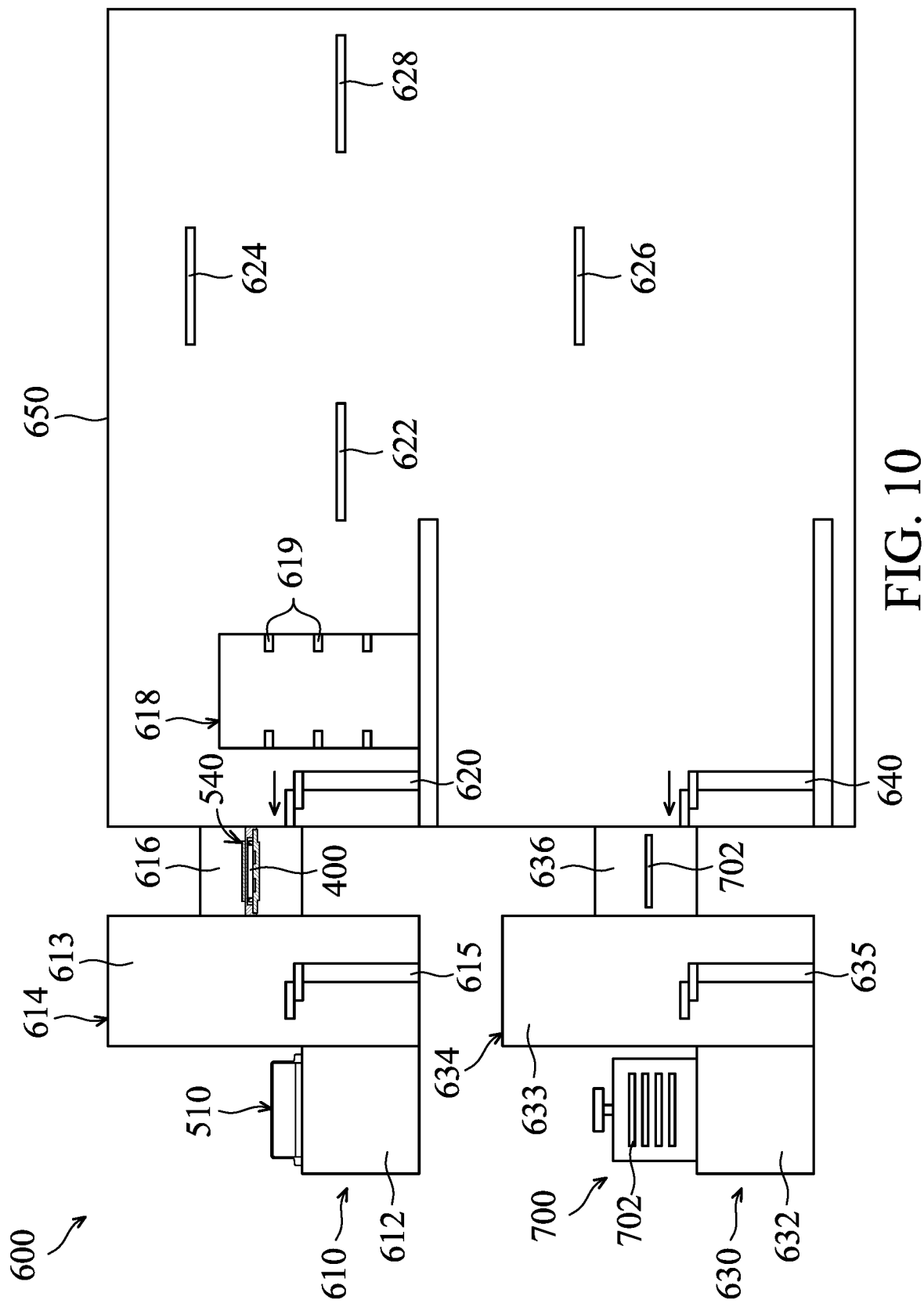
FIG. 10 shows a schematic view of a stage of a method for discharging static charges accumulated on a reticle, in accordance with some embodiments.

When the inner pod 540 is placed in the reticle load lock chamber 616, the robotic arm 615 returns to the housing 613 in the reticle interface module 614, as shown in FIG. 10. At this time, the reticle load lock chamber 616 is sealed and an atmosphere compatible with the vacuum pressure in the exposure chamber 650 is created by altering the gas content of the reticle load lock chamber 616 by such means as adding gas or creating a vacuum, along with other suitable means for adjusting the atmosphere in the reticle load lock chamber 616. When the correct atmosphere has been reached, the transfer mechanism 620 removes the inner pod 540 from the reticle load lock chamber 616. As a result, the inner pod 540, along with the reticle 400, is transferred from an ambient environment (i.e. space in the outer pod 510 and the housing 613) to a vacuum environment (i.e. space in the exposure chamber 650) in the reticle load lock chamber 616 after the reticle container 500 with the reticle 400 are placed into the lithography system 600, as shown in FIG. 10.

For example, when the inner pod 540 along with the reticle 400 is transferred from the ambient environment to the vacuum environment, the static charges accumulated on the reticle 400 may be continuously or may be intermittently neutralized by positively charged particles 562 or negatively charged particles 564 (FIG. 6) produced by the discharging device 550 when the reticle 400 is contained in the inner pod 540.

In some embodiments, the method 800 may further include transferring the wafer 702 from the atmosphere to the vacuum environment. When the wafer 702 is placed in the wafer load lock chamber 636, the wafer 702 is transferred from an ambient environment (i.e. space in the wafer container 700 and the housing 633) to a vacuum environment (i.e. space in the exposure chamber 650). Afterward, the transfer mechanism 640 removes the wafer 702 from the wafer load lock chamber 636, as shown in FIG. 10.

Figure 11:
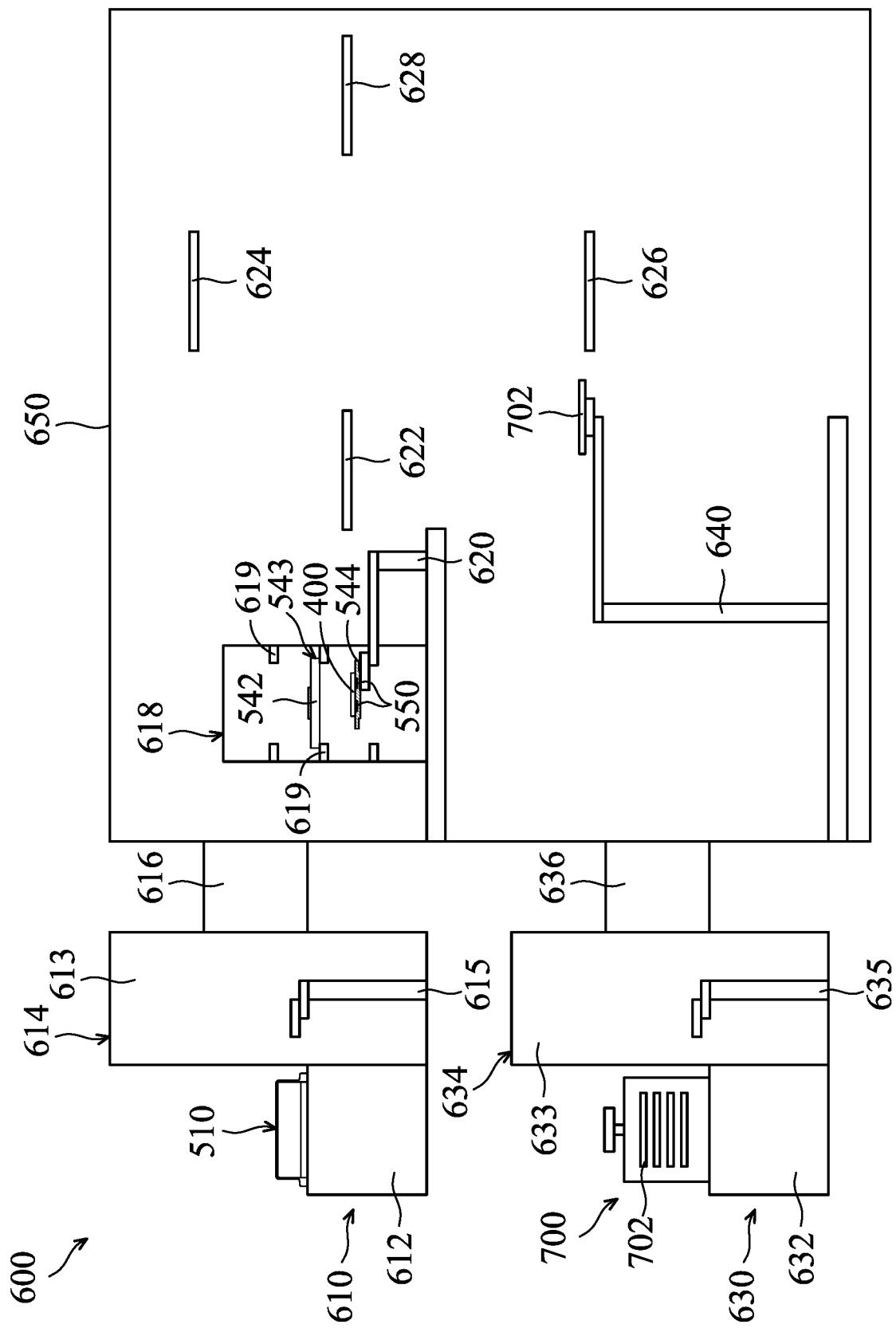
FIG. 11 shows a schematic view of a stage of a method for discharging static charges accumulated on a reticle, in accordance with some embodiments.

The method 800 also includes an operation 806, in which the reticle 400 from the inner pod 540 of the reticle container 500 is removed to the reticle E-clamp 624 in the lithography system 600. In some embodiments, after the inner pod 540 is moved into the vacuum environment, the inner pod 540 is transferred to the cover handling chamber 618 by the transfer mechanism 620, as shown in FIG. 11. In the cover handling chamber 618, the flanges 543 of the cover 542 are supported by the holding members 619, and the cover 542 is left on the holding member 619 by moving the baseplate 544 in the direction indicated by the arrow in FIG. 11. As a result, the cover 542 is removed from the baseplate 544 and the discharge device 550 of the inner pod 540 in the vacuum environment. At this time, the reticle 400 is placed on the discharging device 550 and the baseplate 544, and the baseplate 544 is exposed to the vacuum environment.

For example, when the reticle 400 on the baseplate 544 is exposed to the vacuum environment (e.g., the space in the exposure chamber 650), the static charges accumulated on the reticle 400 may be continuously or may be intermittently neutralized by positively charged particles 562 or negatively charged particles 564 (FIG. 6) produced by the discharging device 550 when the reticle 400 is contained in the inner pod 540.

In some embodiments, the method 800 may further include removing the wafer 702 toward to the wafer E-clamp 626. In some embodiments, after the wafer 702 is moved into the vacuum environment, the wafer 702 is transferred to the in the exposure chamber 650 by the transfer mechanism 640, as shown in FIG. 11.

Figure 12:
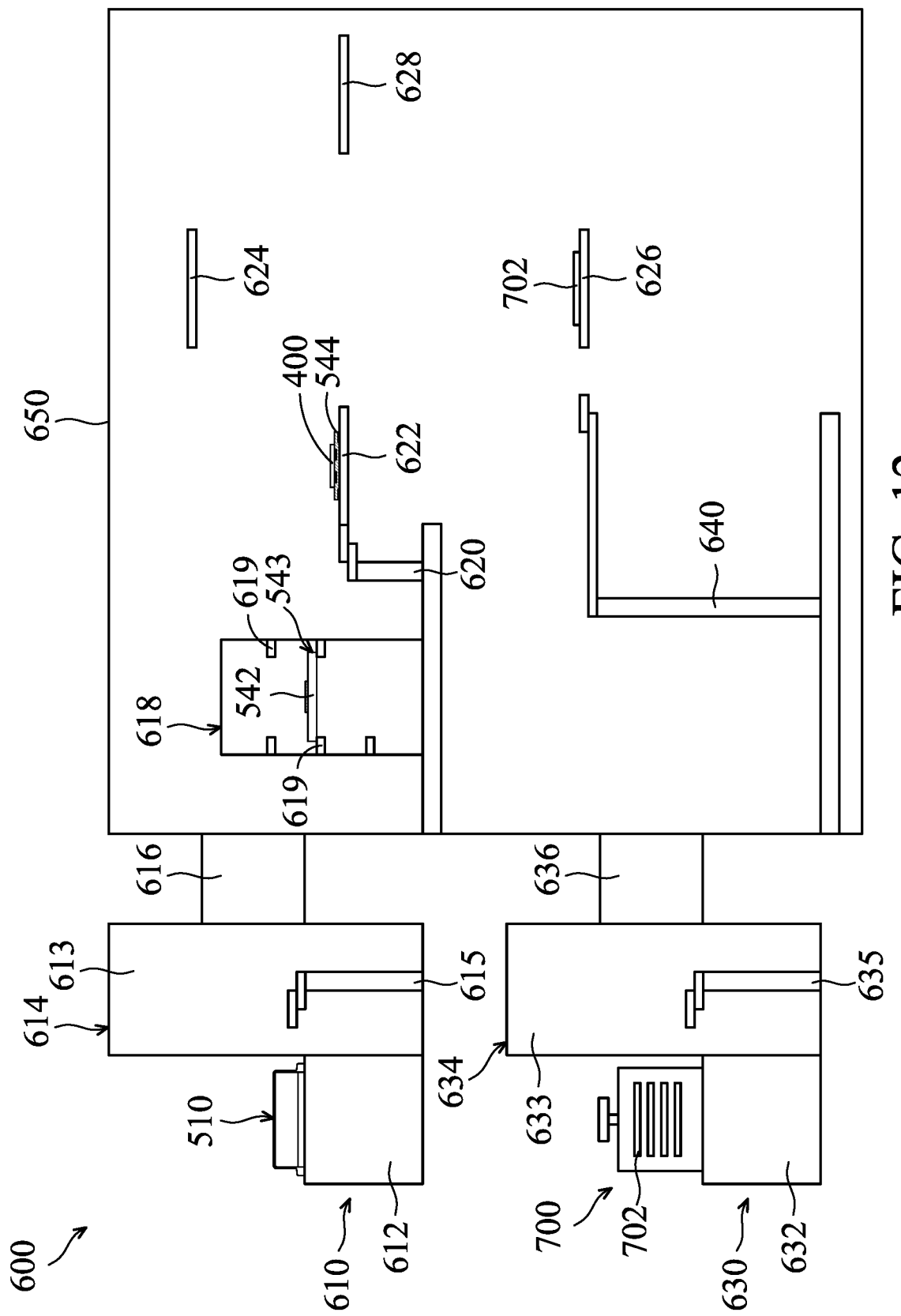
FIG. 12 shows a schematic view of a stage of a method for discharging static charges accumulated on a reticle, in accordance with some embodiments.

In some embodiments, after the cover 542 is removed from the baseplate 544, the discharging device 550 and reticle 400 are placed on the reticle exchanging station 622 by the transfer mechanism 620, as shown in FIG. 12. For example, the reticle exchanging station 622 may be located in a position below the reticle electrostatic-clamp 624.

In some embodiments, the method 800 may further include placing the wafer 702 on the wafer E-clamp 626. As a result, the wafer 702 may be secured by the wafer E-clamp 626 with the clamping force generated by the wafer E-clamp 626 and is ready for the lithography exposure process, such as being subjected to an extreme ultraviolet (EUV) light.

Figure 13:
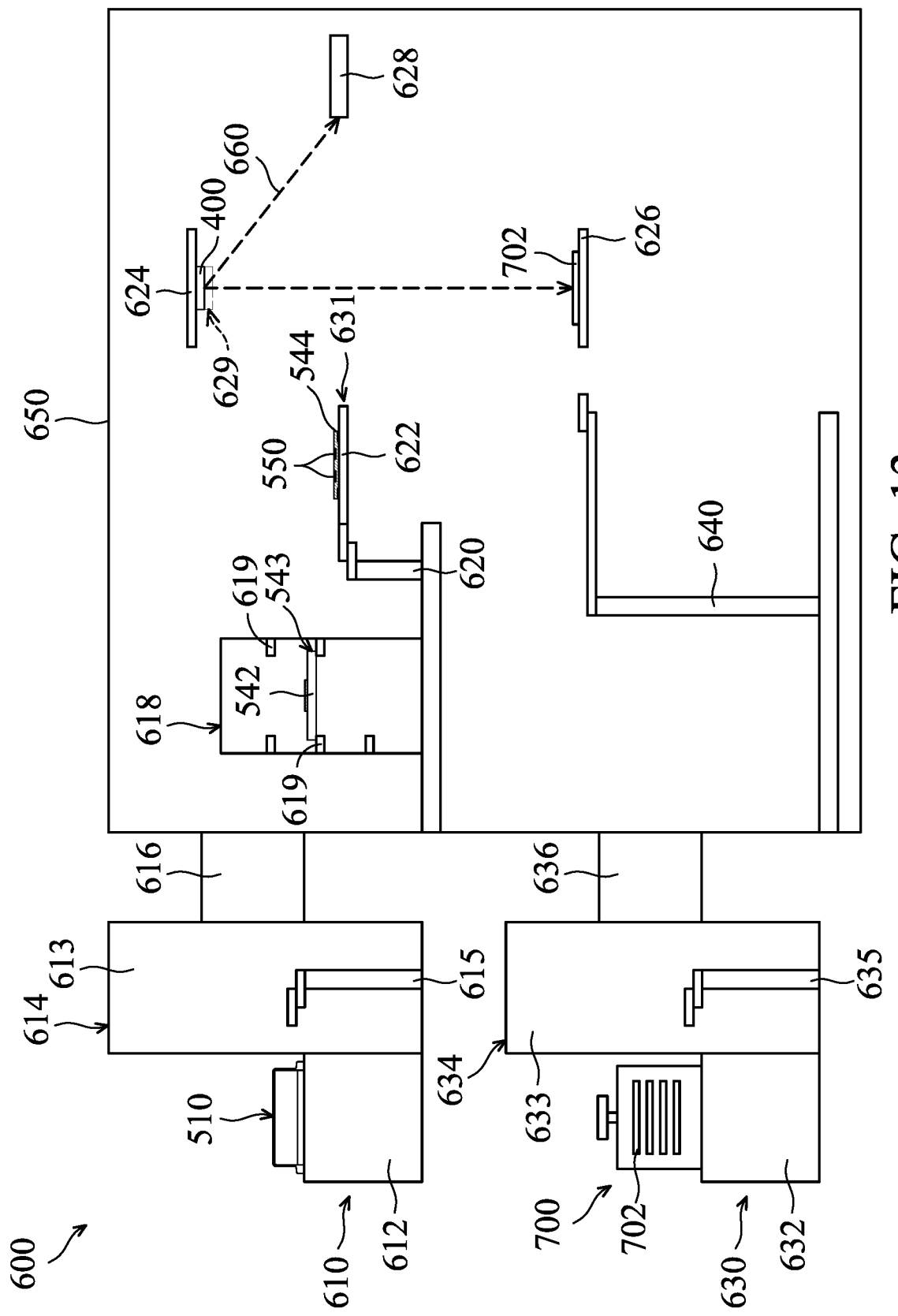
FIG. 13 Shows a Schematic View of a Stage of a Method for Discharging Static Charges Accumulated on a Reticle, in Accordance with Some Embodiments.

Afterwards, the reticle exchanging station 622 is elevated to a loading position 629 as indicated by the dotted lines in FIG. 13 to create a direct contact between the reticle 400 and the reticle E-clamp 624. As a result, the reticle 400 may be secured by the reticle E-clamp 624 with the clamping force generated by the reticle E-clamp 624 and is ready for the lithography exposure process, such as being subjected to an extreme ultraviolet (EUV) light. After the reticle 400 is secured by the reticle E-clamp 624, the vacant baseplate 544 is lowered down to its original position 631 as indicated by solid lines in FIG. 13.

Figure 14:
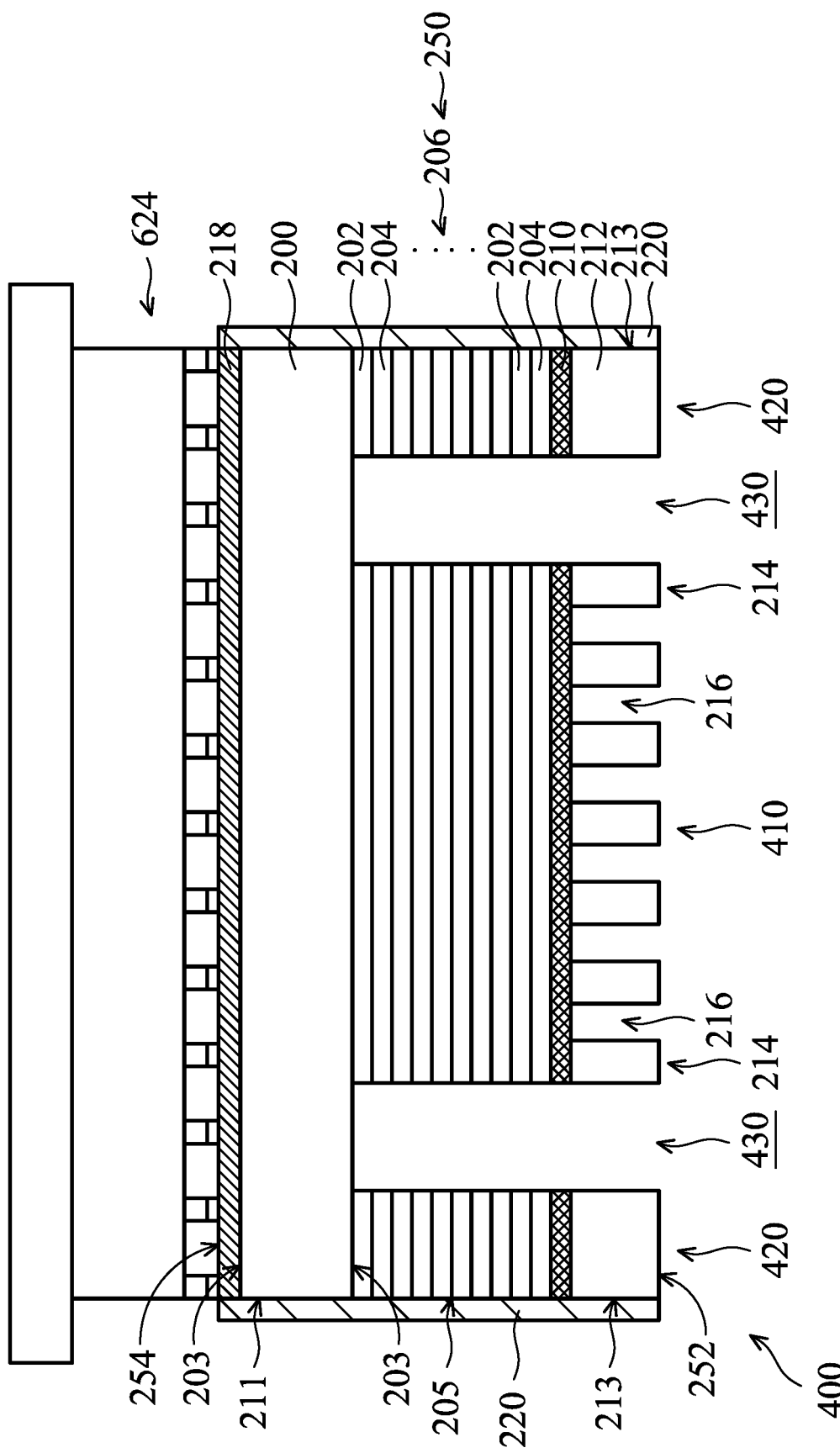
FIG. 14 shows a schematic view of one stage of a method for discharging static charges accumulated on a reticle as the reticle is positioned on a reticle electrostatic-clamp, in accordance with some embodiments.

When the reticle 400 is in contact with the reticle E-clamp 624, the conductive material structure 220 is electrically connected to the reticle E-clamp 624 through the conductive layer 218. Therefore, the static charges accumulated on the reticle 400 are conducted to the reticle E-clamp 624 by the conductive material structure 220 and the conductive layer 218, as shown in FIG. 14.

After the removal of the reticle from the pod to the reticle electrostatic-clamp, a lithography exposure process is performed on the wafer 702 in the vacuum environment using the reticle 400 and the radiation source 628, as shown in FIG. 13. In some embodiments, the radiation source 628 is configured to generate EUV radiation 660 with a wavelength centered at about 13.5 nm. For example, the radiation source 628 utilizes laser-produced plasma (LPP) to generate the EUV radiation 660 by heating a medium such as droplets of tin into a high-temperature plasma using a laser.

The EUV radiation 660 produced by the radiation source 628 may be focused and shapes by an illuminator module (not shown). The illuminator module may include refractive optical components, including monolithic lenses and/or array lenses (e.g. zone plates), and may include reflective optical components, including monolithic mirrors and/or mirror arrays. The optical components are arranged and aligned to project radiation emitted by the radiation source 628 onto the reticle 400 retained in the reticle E-clamp 624. The optical components of the illuminator module may also shape the radiation along the light path in order to produce a particular illumination pattern (e.g., the absorption structure 212 in the pattern region 410) upon the reticle 400.

After being absorbed or reflecting off the reticle 400, the radiation is directed through a projection module (not shown), also referred to as a projection optics box (POB). Similar to the illuminator module, the projection module may include refractive optical components. The optical components of the projection module are arranged and aligned to direct radiation transmitted through or reflecting off the reticle 400 and to project that radiation onto the wafer 702, which is secured to the wafer E-clamp 626.

When the lithography exposure process is performed, the static charges accumulated on the reticle 400 (e.g. on the front-side surface 252 of the reticle 400) are conducted to the reticle E-clamp 624 by the conductive material structure 220 and the conductive layer 218, as shown in FIG. 14.

After the lithography exposure process is performed, the reticle 400 is removed from the reticle E-clamp 624 to the baseplate 544 of the reticle container 500 by the transfer mechanism 620, as shown in FIG. 12. Afterward, the cover 542 may rejoin to the baseplate 544 with the discharge device 550 together to form the inner pod 540 in the exposure chamber 650 in the vacuum environment.

Afterward, the reticle 400 secured by the inner pod 540 may be transferred from exposure chamber 650 to the reticle load lock chamber 616 in the vacuum environment. At this time, the reticle load lock chamber 616 may capable of creating an atmosphere compatible with the reticle interface module 614. When the correct atmosphere has been reached, the robotic arm 615 removes the inner pod 540 from the reticle load lock chamber 616 to the reticle interface module 614. As a result, the inner pod 540, along with the reticle 400, is transferred from the vacuum environment (i.e. the space in the exposure chamber 650) to the ambient environment (i.e. the space in the outer pod 510 and the housing 613).

Afterward, the inner pod 540 in the reticle load lock chamber 616 is moved toward the reticle load port 612 and placed into the outer pod 510 by the robotic arm 615. Therefore, the reticle 400 is placed in the reticle container 500.

For example, during the transferring path of the reticle 400 from the reticle E-clamp 624 to the reticle container 500 after performing the lithography exposure process, the reticle 400 may be placed on the baseplate 544 with the discharging device 550. Therefore, the static charges accumulated on the reticle 400 may be continuously or may be intermittently neutralized by positively charged particles 562 or negatively charged particles 564 (FIG. 6) produced by the discharging device 550.

After the lithography exposure process is performed, the wafer 702 is removed from the wafer E-clamp 626 and transferred back to the wafer load port 632 and placed into the wafer container 700. More specifically, the wafer 702 may be removed from the wafer E-clamp 626 in the exposure chamber 650 to the wafer load lock chamber 636 by the transfer mechanism 640 in the vacuum environment. When the wafer 702 is placed in the wafer load lock chamber 636, the wafer 702 is transferred from the vacuum environment to the ambient environment. Afterward, the wafer 702 in the wafer load lock chamber 636 may be moved toward the wafer load port 632 and placed into the wafer container 700 by the robotic arm 635.

In some embodiments, the method 800 for discharging static charges accumulated on the reticle 400 is utilized in the lithography system 600 to perform a lithography exposure process. For example, the method 800 may uses the reticle 400 (FIGS. 1, 2A and 2B) secured in the reticle container 500 (FIGS. 4, 5A, 5B and 5C). When the reticle 400 is placed on the baseplate 544 of the reticle container 500 in the ambient environment or the vacuum environment, the static charges accumulated on the reticle 400 may be continuously or intermittently neutralized by positively charged particles 562 or negatively charged particles 564 produced by the discharging device 550 on the baseplate 544. Therefore, the reticle container 500 may prevent the reticle 400 from the particulate contamination in the ambient environment or the vacuum environment. When the reticle 400 is in contact with the reticle E-clamp 624 (ready for the lithography exposure process or during the lithography exposure process), the conductive material structure 220 of the reticle 400 is electrically connected to the reticle E-clamp 624. The static charges accumulated on the reticle 400 are conducted to the reticle E-clamp 624 by the conductive material structure 220 of the reticle 400. Therefore, the conductive material structure 220 may protect the absorption structure 212 in the pattern region 410 of the reticle 400 from the electrostatic discharge damage.

As described previously, the reticle (e.g., the reticles 400, 400A, 400B, 400C and 400D) includes a conductive material structure (e.g. the conductive material structures 220, 220A, 220B, 220C and 220D) over the sidewall surface 211 of the mask substrate 200 and the sidewall surface 213 of the absorption structure 212. In some embodiments, the conductive material structure is in contact with the absorption structure and the conductive layer over the back-side surface 203 of mask substrate 200. The conductive material structure may conduct the static charges accumulated on the front-side surface 252 of the reticle 400 to the reticle electrostatic-clamp (e.g. the reticle E-clamp 624 in the lithography system 600) when the conductive material structure of the reticle is in contact with the reticle electrostatic-clamp. Therefore, the conductive material structure may protect the opaque regions 214 of absorption structure 212 (e.g., the reticle patterns) of the reticle from the electrostatic discharge damage.

As described previously, the reticle container 500 includes the discharging device 550 on the baseplate 544. In some embodiments, the discharging device is configured to neutralize static charges accumulated on the reticle. When the reticle is contained in the reticle container 500 or placed on the baseplate 544 in the ambient environment or the vacuum environment, the discharging device may continuously or intermittently produce the positively charged particles 562 or the negatively charged particles 564 to neutralize the static charges accumulated on the reticle 400.

As described previously, the method 800 for discharging static charges accumulated on the reticle 400 includes neutralizing static charges accumulated on the reticle by the positively charged particles 562 or the negatively charged particles 564 produced by the discharging device 550 when the reticle 400 is contained in the reticle container 500 (e.g. on the baseplate 540 and in the inner pod 540). Therefore, the reticle container 500 may prevent the reticle 400 from the particulate contamination in the ambient environment or the vacuum environment. In addition, the method 800 for discharging static charges accumulated on the reticle 400 may include conducting the static charges accumulated on the reticle 400 to the reticle electrostatic-clamp 624 by the conductive material structure 220 when the conductive material structure 220 of the reticle 400 is in contact with the reticle electrostatic-clamp 624 in the lithography system 600. Therefore, the conductive material structure 220 may protect the absorption structure 212 in the pattern region 410 of the reticle 400 from the electrostatic discharge damage.

Embodiments of a reticle, a reticle container and a method for discharging static charges accumulated on a reticle are provided. The reticle includes a mask substrate, a reflective multilayer (ML) structure, a capping layer, an absorption structure and a conductive material structure. The mask substrate has a front-side surface and a back-side surface. The reflective ML structure is positioned over the front-side surface of mask substrate. The capping layer is positioned over the reflective ML structure. The absorption structure is positioned over the capping layer. The conductive material structure is positioned over a sidewall surface of the mask substrate and a sidewall surface of the absorption structure. The conductive material structure may protect the absorption structure in the pattern region of the reticle from the electrostatic discharge damage.

In some embodiments, a reticle is provided. The reticle includes a mask substrate, a reflective multilayer (ML) structure, a capping layer, an absorption structure and a conductive material structure. The mask substrate has a front-side surface and a back-side surface. The reflective ML structure is positioned over the front-side surface of mask substrate. The capping layer is positioned over the reflective ML structure. The absorption structure is positioned over the capping layer. The conductive material structure is positioned over a sidewall surface of the mask substrate and a sidewall surface of the absorption structure.

In some embodiments, the reticle further includes a conductive layer over the back-side surface of mask substrate. The conductive material structure is in contact with the absorption structure and the conductive layer. In some embodiments, the conductive material structure surrounds the conductive layer. In some embodiments, the conductive material structure includes a plurality of conductive strips. Each of the conductive strips has two terminals in contact with the absorption structure and the conductive layer, respectively. In some embodiments, the conductive material structure is spiral-shaped about an axis perpendicular to the front-side surface of the mask substrate. In some embodiments, the reticle includes: a pattern region, a border region, and a bridge region. The border region surrounds the pattern region and separated from the pattern region. The bridge region is positioned between the pattern region and the border region. The bridge region connects the pattern region and the border region. The capping layer and the absorption structure are positioned in the pattern region, the border region and the bridge region. In some embodiments, the absorption structure in the pattern region and the absorption structure in the border region are electrically connected to the capping layer.

In some embodiments, a reticle container is provided. The reticle container includes a cover, a baseplate and a discharging device. The cover is configured to protect a reticle. The baseplate has a top surface configured to engage to the cover and a bottom surface opposite to the top surface. The discharging device is positioned on the baseplate. The discharging device is configured to neutralize static charges accumulated on the reticle.

In some embodiments, a method for discharging static charges accumulated on a reticle is provided. The method includes neutralizing static charges accumulated on the reticle by positively charged particles or negatively charged particles produced by a discharging device when the reticle is contained in a reticle container. The method further includes removing the reticle from the reticle container to a reticle electrostatic-clamp in a lithography system.

In some embodiments, a reticle is provided. The reticle includes a mask substrate, a reflective multilayer (ML) structure, an absorption structure, a conductive layer, and a conductive material structure. The mask substrate has a front-side surface and a back-side surface. The reflective ML structure is positioned over the front-side surface of the mask substrate. The absorption structure is positioned over the reflective ML structure. The conductive layer is positioned over the back-side surface of mask substrate. The conductive material structure is electrically connected to the absorption structure and the conductive layer.

In some embodiments, a bottom surface of the conductive layer is level with a bottom surface of the conductive material structure. In some embodiments, the reticle further includes a capping layer disposed between the reflective ML structure and the absorption structure. A sidewall surface of the capping layer is level with a sidewall surface of the absorption structure. In some embodiments, the conductive material structure is formed on the sidewall surface of the capping layer and the sidewall surface of the absorption structure. In some embodiments, the conductive material structure is grid-shaped and covers a portion of a sidewall of the reflective ML structure. In some embodiments, the conductive material structure is spiral-shaped about an axis perpendicular to the front-side surface of the mask substrate. In some embodiments, the conductive material structure is formed on the entire sidewall of the reflective ML structure.

In some embodiments, a reticle is provided. The reticle includes a mask substrate, a reflective multilayer (ML) structure, and a conductive material structure. The reflective ML structure is positioned over the mask substrate. The conductive material structure covers a sidewall surface of the reflective ML structure. The reticle includes: a pattern region, a border region, and a bridge region. The border region surrounds the pattern region and is separated from the pattern region via a trench. The bridge region is positioned between the pattern region and the border region. The bridge region connects the pattern region and the border region via the trench.

In some embodiments, the reticle further includes an absorption structure formed over the reflective ML structure. In some embodiments, the reticle further includes a conductive layer over the mask substrate and opposite to the reflective ML structure. The conductive material structure is electrically connected to the absorption structure and the conductive layer. In some embodiments, the conductive material structure is grid-shaped and covers a portion of the sidewall surface of the reflective ML structure. In some embodiments, the conductive material structure is spiral-shaped about an axis perpendicular to a top surface of the mask substrate. In some embodiments, the conductive material structure is formed on the entire sidewall surface of the reflective ML structure.

In some embodiments, the top surface of the baseplate has a reticle region configured to support the reticle and a peripheral region surrounding the reticle region. In some embodiments, the discharging device includes an alpha-ionizer configured to emit alpha particles. In some embodiments, a top surface of the discharging device is between the top surface and the bottom surface of the baseplate. In some embodiments, the discharging device is positioned in a recessed groove of the baseplate. In some embodiments, a bottom surface of the recessed groove is between the top surface and the bottom surface of the baseplate. In some embodiments, the bottom surface of the baseplate covers the discharging device.

In some embodiments, a reticle container is provided. The reticle container includes an outer pod including a top cover portion and a bottom cover portion; and an inner pod accommodated in a space formed by engaging the top cover portion and the bottom cover portion. The inner pod includes: a cover configured to protect a reticle; a baseplate; and a discharging device on the baseplate. The baseplate has: a top surface configured to engage to the cover; and a bottom surface opposite to the top surface. The discharging device is configured to neutralize static charges accumulated on the reticle. In some embodiments, the bottom cover portion includes a plurality of supporters on a top surface of the bottom cover portion. In some embodiments, when the inner pod is fastened in the outer pod, the baseplate of the inner pod is in contact with the supporters of the bottom cover portion of the outer pod. In some embodiments, the top cover portion includes a plurality of supporters protruding toward the bottom cover portion. In some embodiments, the cover includes a plurality of fasteners positioned close to four corners in a periphery region of the cover, and the fasteners are configured to fasten the cover to the baseplate. In some embodiments, the bottom surface of the baseplate covers the discharging device. In some embodiments, the discharging device continuously produces positively charged particles or negatively charged particles. In some embodiments, the discharging device intermittently produces positively charged particles or negatively charged particles.

In some embodiments, a reticle container is provided. The reticle container includes: a cover configured to protect a reticle; a baseplate; and a discharging device on the baseplate. The baseplate has: a top surface configured to engage to the cover; a bottom surface opposite to the top surface; and a plurality of supporters positioned on the top surface and close to four corners in a periphery region of the baseplate, wherein the supporters are configured to support the reticle. The discharging device is configured to neutralize static charges accumulated on the reticle. In some embodiments, the cover includes a plurality of fasteners positioned close to four corners in a periphery region of the cover, and the fasteners are configured to fasten the cover to the baseplate. In some embodiments, the supporters partially overlap with the fasteners in a top view. In some embodiments, the supporters are spaced apart from edges of the baseplate. In some embodiments, the reticle container further includes a fixed device fastening the discharging device on the baseplate, wherein the fixed device is located between two of the supporters.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of lithography process, comprising:
   forming a photoresist layer over a semiconductor substrate;
   patterning the photoresist layer to form a pattern by emitting radiation from a radiation source via a reticle onto the photoresist layer in an exposure chamber, wherein the reticle is transferred from a reticle container to the exposure chamber; and
   patterning the semiconductor substrate through the pattern of the photoresist layer,
   wherein the reticle container further comprises:
   a cover configured to protect a reticle;
   a baseplate having:
      a top surface configured to engage to the cover; and
      a bottom surface opposite to the top surface; and
   a discharging device on the baseplate, wherein the discharging device is configured to neutralize static charges accumulated on the reticle.

2. The method as claimed in claim 1, further comprising supporting the reticle by the reticle container, wherein the top surface of the baseplate has a reticle region configured to support the reticle and a peripheral region surrounding the reticle region.

3. The method as claimed in claim 1, wherein the discharging device comprises an alpha-ionizer configured to emit alpha particles.

4. The method as claimed in claim 1, wherein a top surface of the discharging device is between the top surface and the bottom surface of the baseplate.

5. The method as claimed in claim 1, wherein the discharging device is positioned in a recessed groove of the baseplate.

6. The method as claimed in claim 5, wherein a bottom surface of the recessed groove is between the top surface and the bottom surface of the baseplate.

7. The method as claimed in claim 1, further comprising neutralizing static charges accumulated on the reticle by the discharging device when the reticle is supported by the reticle container.

8. A method of lithography process, comprising:
   transferring a reticle from a reticle container to an exposure chamber;
   transferring a semiconductor substrate to the exposure chamber, wherein a photoresist layer is formed over the semiconductor substrate;
   forming a first pattern on the photoresist layer by emitting radiation from a radiation source via the reticle; and
   patterning the semiconductor substrate to form a second pattern according to the first pattern of the photoresist layer,
   wherein the reticle container further comprises:
   an outer pod comprising a top cover portion and a bottom cover portion; and
   an inner pod accommodated in a space formed by engaging the top cover portion and the bottom cover portion, wherein the inner pod comprises:
   a cover configured to protect a reticle;
   a baseplate having:
      a top surface configured to engage to the cover; and
      a bottom surface opposite to the top surface; and
   a discharging device on the baseplate, wherein the discharging device is configured to neutralize static charges accumulated on the reticle.

9. The method as claimed in claim 8, further comprising supporting the baseplate by a plurality of supporters on a top surface of the bottom cover portion.

10. The method as claimed in claim 9, wherein when the inner pod is fastened in the outer pod, the baseplate of the inner pod is in contact with the supporters of the bottom cover portion of the outer pod.

11. The method as claimed in claim 8, wherein the top cover portion comprises a plurality of supporters protruding toward the bottom cover portion.

12. The method as claimed in claim 8, further comprising fastening the cover to the baseplate by a plurality of fasteners of the cover, wherein the fasteners are positioned close to four corners in a periphery region of the cover.

13. The method as claimed in claim 8, wherein the bottom surface of the baseplate covers the discharging device.

14. The method as claimed in claim 8, further comprising neutralizing static charges accumulated on the reticle by continuously producing positively charged particles or negatively charged particles from the discharging device.

15. The method as claimed in claim 8, further comprising neutralizing static charges accumulated on the reticle by intermittently producing positively charged particles or negatively charged particles from the discharging device.

16. A method of lithography process, comprising:
transferring a reticle from a reticle container to an exposure chamber;
providing a semiconductor substrate having a photoresist layer;
forming a patterned photoresist layer by emitting radiation from a radiation source via the reticle onto the photoresist layer; and
forming a circuit pattern on the semiconductor substrate according to the patterned photoresist layer,
wherein the reticle container further comprises:
a cover configured to protect a reticle;
a baseplate having:
a top surface configured to engage to the cover;
a bottom surface opposite to the top surface; and
a plurality of supporters positioned on the top surface and close to four corners in a periphery region of the baseplate, wherein the supporters are configured to support the reticle; and
a discharging device on the baseplate, wherein the discharging device is configured to neutralize static charges accumulated on the reticle.

17. The method as claimed in claim 16, further comprising fastening the cover to the baseplate by comprises a plurality of fasteners of the cover, wherein the fasteners are positioned close to four corners in a periphery region of the cover.

18. The method as claimed in claim 17, wherein the supporters partially overlap with the fasteners in a top view.

19. The method as claimed in claim 16, wherein the supporters are spaced apart from edges of the baseplate.

20. The method as claimed in claim 16, further comprising fastening the discharging device on the baseplate by a fixed device, wherein the fixed device is located between two of the supporters.

* * * * *